(12) United States Patent
Juengling

(10) Patent No.: US 10,978,484 B2
(45) Date of Patent: Apr. 13, 2021

(54) METHODS USED IN FORMING AN ARRAY OF MEMORY CELLS

(71) Applicant: Micron Technology, Inc., Boise, ID (US)

(72) Inventor: Werner Juengling, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/848,718

(22) Filed: Apr. 14, 2020

(65) Prior Publication Data
US 2020/0243547 A1 Jul. 30, 2020

Related U.S. Application Data

(62) Division of application No. 16/044,703, filed on Jul. 25, 2018, now Pat. No. 10,692,887.
(Continued)

(51) Int. Cl.
*H01L 27/088* (2006.01)
*H01L 27/1159* (2017.01)
(Continued)

(52) U.S. Cl.
CPC ........ *H01L 27/1159* (2013.01); *G11C 11/223* (2013.01); *H01L 21/823431* (2013.01); *H01L 27/0886* (2013.01); *H01L 27/10814* (2013.01); *H01L 27/10826* (2013.01); *H01L 27/10879* (2013.01); *H01L 27/11507* (2013.01);
(Continued)

(58) Field of Classification Search
CPC ............. H01L 27/0886; H01L 27/1052; H01L 27/1159; H01L 27/108–27/10826; H01L 27/10844–10858; H01L 27/10847; H01L 27/10852; H01L 27/10873–10897; H01L 27/10879; H01L 27/10882; H01L 27/10891; H01L 27/11507; H01L 27/10814; H01L 29/78391; H01L 29/785; H01L 29/7851; H01L 29/7855; H01L 29/7858; H01L 29/78624; H01L 29/40111; H01L 21/027–0338; H01L 21/308–3088; H01L 21/28291; H01L 21/823431; H01L 21/823475; H01L 21/823481; H01L 21/823821; H01L 21/823871; H01L 21/823878; H01L 21/8239; H01L 2924/1436–14369; H01L 23/53266;
(Continued)

(56) References Cited

U.S. PATENT DOCUMENTS 7,601,586 B2  10/2009  Liao et al.
8,293,602 B2  10/2012  Juengling
(Continued)

*Primary Examiner* — Natalia A Gondarenko
(74) *Attorney, Agent, or Firm* — Wells St. John P.S.

(57) ABSTRACT

In some embodiments, a method used in forming an array of memory cells comprises uses no more than two photolithographic masking steps are used in forming both: (a) sense lines longitudinally extending in a column direction that are individually directly above and electrically coupled to the upper source/drain regions of multiple of the second pedestals in the column direction; and (b) spaced elevationally-extending vias laterally between immediately-adjacent of the sense lines directly above and electrically coupled to the upper source/drain regions of multiple of the first pedestals. Other embodiments are disclosed.

13 Claims, 32 Drawing Sheets

Related U.S. Application Data

(60) Provisional application No. 62/551,713, filed on Aug. 29, 2017.

(51) Int. Cl.

| | | |
|---|---|---|
| *H01L 27/108* | (2006.01) | |
| *H01L 27/11507* | (2017.01) | |
| *H01L 27/11592* | (2017.01) | |
| *H01L 29/78* | (2006.01) | |
| *H01L 21/28* | (2006.01) | |
| *H01L 21/8234* | (2006.01) | |
| *H01L 21/8239* | (2006.01) | |
| *H01L 21/8242* | (2006.01) | |
| *G11C 11/22* | (2006.01) | |

(52) U.S. Cl.
CPC .. *H01L 27/11592* (2013.01); *H01L 29/40111* (2019.08); *H01L 29/78391* (2014.09); *H01L 29/785* (2013.01)

(58) Field of Classification Search
CPC ............... H01L 23/535; H01L 23/5329; H01L 27/11592; H01L 27/10855; G11C 11/223
USPC ....... 438/128, 435; 257/4, 306, 296, E21.54, 257/E21.606, E27.084, E45.001
See application file for complete search history.

(56) References Cited

U.S. PATENT DOCUMENTS

| | | |
|---|---|---|
| 8,598,653 B2 | 12/2013 | Juengling |
| 8,741,758 B2 | 6/2014 | Juengling |
| 8,766,354 B2 | 7/2014 | Chung et al. |
| 9,773,728 B1 | 9/2017 | Juengling |
| 9,773,788 B1 | 9/2017 | Juengling |
| 9,847,337 B1 | 12/2017 | Juengling |
| 9,853,027 B1 | 12/2017 | Juengling |
| 10,008,503 B1 | 6/2018 | Juengling |
| 10,008,504 B1 | 6/2018 | Juengling |
| 10,014,302 B1 | 7/2018 | Juengling |
| 2007/0052040 A1* | 3/2007 | Schwerin .......... H01L 27/10876 257/390 |
| 2007/0262375 A1 | 11/2007 | Juengling |
| 2009/0207681 A1 | 8/2009 | Juengling |
| 2009/0237996 A1 | 9/2009 | Kirsch et al. |
| 2009/0238010 A1 | 9/2009 | Juengling |
| 2009/0251946 A1 | 10/2009 | Juengling |
| 2009/0294842 A1 | 12/2009 | Juengling |
| 2011/0193157 A1 | 8/2011 | Juengling |
| 2012/0126338 A1 | 5/2012 | Juengling |
| 2012/0132970 A1 | 5/2012 | Park et al. |
| 2014/0284812 A1 | 9/2014 | Somaschini et al. |
| 2016/0172304 A1* | 6/2016 | Lee .................. H01L 27/10888 438/655 |
| 2018/0182763 A1 | 6/2018 | Juengling |

\* cited by examiner

METHODS USED IN FORMING AN ARRAY OF MEMORY CELLS

RELATED PATENT DATA

This patent resulted from a divisional of U.S. patent application Ser. No. 16/044,703 which was filed Jul. 25, 2018, which claims priority to and the benefit of U.S. Provisional Application No. 62/551,713 which was filed Aug. 29, 2017, each of which is hereby incorporated by reference herein.

TECHNICAL FIELD

Embodiments disclosed herein pertain to methods used in forming an array of memory cells.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Field effect transistors may be ferroelectric wherein at least some portion of the gate construction (e.g., the gate insulator) comprises ferroelectric material. Two different polarized states of the ferroelectric material in transistors may be characterized by different threshold voltage ($V_t$) for the transistor or by different channel conductivity for a selected operating voltage.

One type of transistor is a fin field effect transistor (finFET). Each finFET includes a fin (a tall thin semiconductor member) typically extending generally perpendicularly from a substrate. The fin comprises a pair of opposing sidewalls, and gate material is provided along at least one of the sidewalls. The gate material is spaced from the sidewalls by gate insulator material. A pair of source/drain regions is provided within the fin, and a channel region extends between the source/drain regions. In operation, the gate is used to selectively control current flow within the channel region. The finFETs may be used as access transistors in integrated memory arrays, such as, for example, dynamic random access memory (DRAM) arrays. In some applications, finFETs have their source/drain regions on a pair of upwardly-projecting pedestals, and the channel region is along a trough or valley extending between the pedestals. A charge-storage device (for instance, a capacitor) is electrically coupled to one of the source/drain regions, and a sense line is electrically coupled to the other of the source/drain regions. The gate is beneath the source/drain regions, and extends along the valley comprising the channel region. As memory cell size has decreased and density has increased, it has become more difficult to align the charge-storage device with the targeted source/drain regions to which such electrically couple.

DETAILED DESCRIPTION OF EXAMPLE EMBODIMENTS

Figure 1:
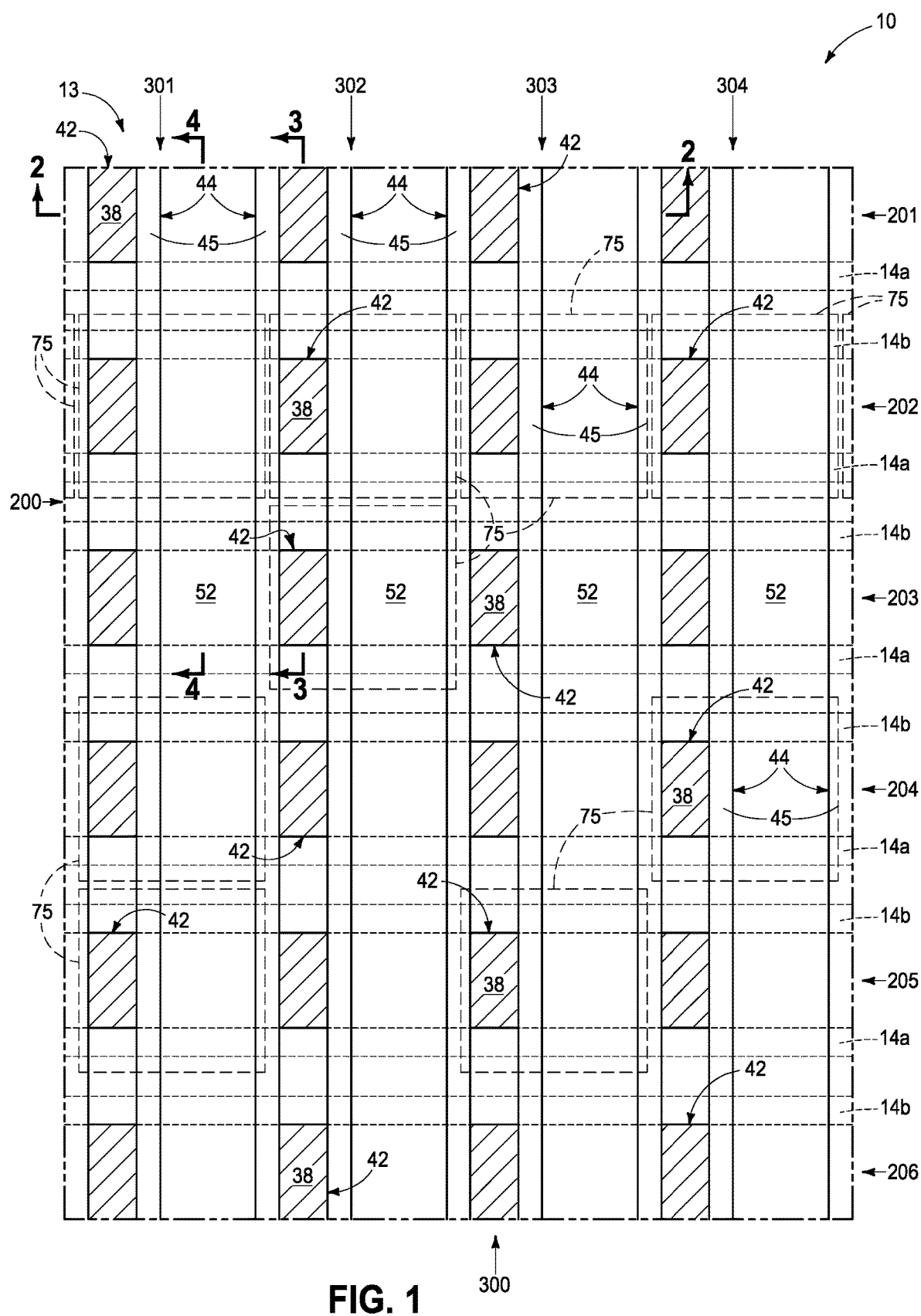
FIG. 1 is a diagrammatic top view of a portion of a device comprising a memory array manufactured in accordance with a method embodiment of the invention.

Embodiments of the invention encompass methods used in forming an array of memory cells which in some embodiments individually comprise a transistor electrically coupled to a charge-storage device. An example resultant construction of such an array manufactured in accordance with methods of the invention is initially described with reference to FIGS. 1-5. Alternate constructions may result.

A substrate, construction, or device 10 in FIGS. 1-4 has a base substrate 11 that may include any one or more of conductive/conductor/conducting (i.e., electrically herein), semiconductive/semiconductor semiconducting, or insulative/insulator/insulating (i.e., electrically herein) materials. Various materials have been formed above base substrate 11. Materials may be aside, elevationally inward of, or elevationally outward of the FIGS. 1-4—depicted materials. For example, other partially or wholly fabricated components of integrated circuitry may be provided somewhere above, about, or within base substrate 11. Control and/or other peripheral circuitry for operating components within an array of memory cells may also be fabricated, and may or may not be wholly or partially within an array or sub-array. Further, multiple sub-arrays may also be fabricated and operated independently, in tandem, or otherwise relative one another. As used in this document, a "sub-array" may also be considered as an array. Example base substrate 11 comprises suitably doped semiconductor material 15 (e.g., monocrystalline silicon) that in part functions as a channel of transistors.

FIGS. 1-4 diagrammatically illustrate a portion of an example array 13 of memory cells 75 individually comprising a transistor 12 and a charge-storage device 50. Example memory cell outlines 75 of only some of twenty-four FIG. 1—visible memory cells are collectively shown in FIGS. 1-4, although thousands, millions, etc. would likely be fabricated within array 13. Substrate 10 comprises rows 201, 202, 203, 204, 205, and 206 and columns 301, 302, 303, and 304 of transistors 12, which in one example are finFET or finFET-like. An access line 14a and/or 14b (e.g., TiN) interconnects multiple transistors 12 along individual rows 201-206 in a row direction 200. Transistors 12 individually comprise a first elevationally-extending pedestal 16 and a second elevationally-extending pedestal 18 (e.g., each of horizontal thickness of about 12 nm by about 12 nm, and horizontally separated by about 12 nm). Such pedestals are joined to one another through a valley region 20. For example, and as shown, pedestals 16, 18 and valley region 20 comprise a fin of a finFET and have the appearance of a tuning fork in the FIG. 2 cross-section.

First pedestal 16 comprises an upper source/drain region 22 and second pedestal 18 comprises an upper source/drain region 24. Such may be heavily doped with a conductivity-enhancing impurity to be electrically conductive, for example having a dopant concentration of at least $10^{20}$ atoms/cm$^3$. Source/drain regions 22 and 24 are shown with stippling and are shown with a lowest dashed-line interface with a channel region 26 to diagrammatically illustrate approximate lower boundaries of regions 22 and 24. Valley region 20 comprises channel region 26, and in one example and as shown, with channel region 26 also extending upwardly to within and thereby comprising lowest portions of pedestals 16 and 18. Channel region 26 may be suitably doped with a conductivity-modifying impurity likely of the opposite conductivity-type of the dopant in regions 22 and 24, for example to a channel dopant concentration less than or equal to about $10^{16}$ atoms/cm$^3$.

A transistor gate is operatively laterally proximate at least one side of the channel region and comprises a portion of an individual access line. In the depicted example, a transistor gate is operatively laterally proximate both sides of channel region 26 as a portion of individual access lines 14a and 14b. Access lines 14a and 14b (e.g., individually about 7 nm wide and about 40 nm tall) may be directly electrically coupled together (not shown), for example outside of array 13, or may not be so directly electrically coupled. A gate insulator 28 (e.g., one or more of silicon dioxide, silicon nitride, hafnium oxide, high-k materials, ferroelectric materials, etc. of about 6 nm thickness) is between gates/access lines 14a, 14b and channel regions 26. Example insulator material 30 (e.g., SiO$_2$ having horizontal thickness of about 12 nm by about 12 nm, and about 70 nm tall) is between first pedestal 16 and second pedestals 18 within a single transistor 12 (i.e., intra-transistor) and an insulator material 31 (e.g., SiO$_2$ having horizontal thickness of about 12 nm, and about 130 nm tall) is between second pedestals 18 and first pedestals 16 of different transistors 12 (i.e., inter-transistor). Materials 30 and 31 may be of the same composition relative one another and/or of the same composition relative gate insulator 28.

In some embodiments, conductive material 34 (e.g., about 20 nm thickness) is formed above and electrically coupled to upper source/drain regions 22 and 24 of first and second pedestals 16 and 18, respectively. In some embodiments and as shown, conductive material 34 is formed directly against and thereby is directly electrically coupled to upper source/drain regions 22 and 24. In one embodiment, conductive material 34 comprises conductively-doped semiconductor material (e.g., conductively-doped polysilicon having a conductivity-enhancing dopant concentration of at least $10^{20}$ atoms/cm$^3$) and alternately or additionally may comprise metal material.

Sense lines 36 (e.g., about 24 nm wide) longitudinally extend in a column direction 300 and are individually directly above and electrically coupled to, in one embodiment directly electrically coupled to, upper source/drain regions 24 of multiple second pedestals 18. In one example, conductive material 34 may be considered as being part of sense lines 36, and regardless in one embodiment sense lines 36 are directly electrically coupled to upper source/drain regions 24 of multiple second pedestals 18 through conductive material 34. Example sense lines 36 are shown as comprising two conductor materials 38 and 40, for example a lower metal material 38 (e.g., TiN of about 8 nm thickness) and an upper metal material 40 (e.g., W of about 30 nm thickness). Insulator material 52 (e.g., silicon dioxide and/or silicon nitride of about 22 nm thickness) is atop sense lines 36.

Spaced elevationally-extending conductive vias 42 are laterally between immediately-adjacent sense lines 36 directly above and electrically coupled to upper source/drain regions 22 of multiple first pedestals 16. In one embodiment and as shown, vias 42 are directly electrically coupled to upper source/drain regions 22 through conductive material 34. Example elevationally-extending vias 42 are shown as comprising conductor material 38 (e.g., TiN horizontally about 24 nm by about 15 nm, and about 60 nm tall). Insulator material 44 (e.g., about 5 nm thickness) is shown as electrical isolation between sense lines 36 and vias 42. Such, by way of example, is shown as comprising a solid material 45 and a void space 46 (e.g., an air gap). Insulator material 48 (e.g., about 24 nm thickness) is shown as electrical isolation between immediately-adjacent vias 42 and such may also include one or more void spaces (not shown). Materials 45 and/or 48 may be of the same composition relative one another and/or relative insulator materials 30 and/or 31.

Example charge-storage devices 50 are schematically shown as being electrically coupled to, in one embodiment directly electrically coupled to, individual elevationally-extending vias 42. In one embodiment and as shown, the charge-storage devices individually are a capacitor. In one embodiment and as shown, individual memory cells 75 comprise a combination of a transistor 12 and a charge-storage device 50, for example as might be encompassed in DRAM circuitry. Alternate existing or yet-to-be-developed charge-storage devices may be used, including wherein memory cells 75 may be non-volatile (e.g., when the capacitor insulator of a capacitor storage-device 50 is ferroelectric). Additionally and/or alternately, transistors 12 may comprise one or more charge-trapping regions (not shown) and/or one of more charge-storage regions (not shown) whereby memory cells 75 may be non-volatile.

Figure 5:
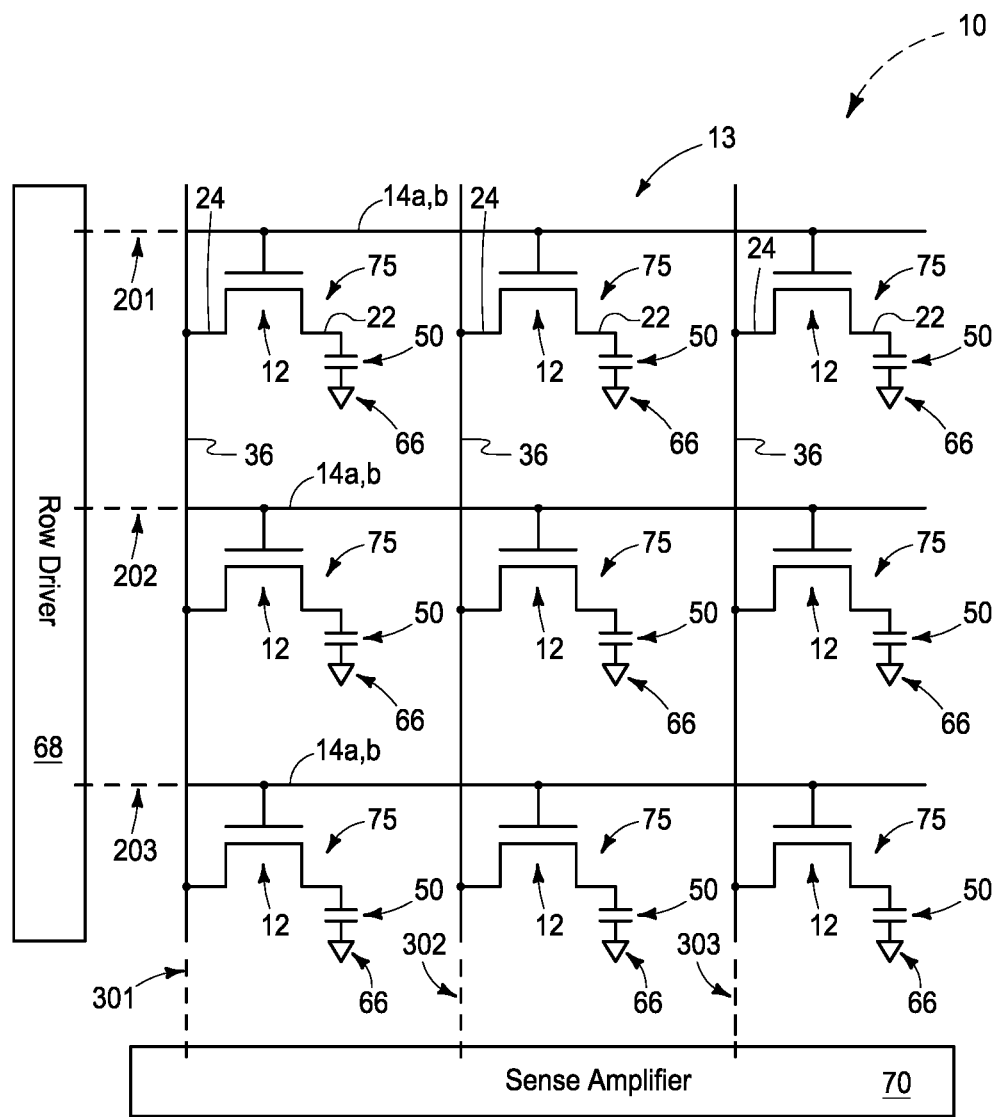
FIG. 5 is a diagrammatic schematic of a portion of the device of FIG. 1.
Figure 6:
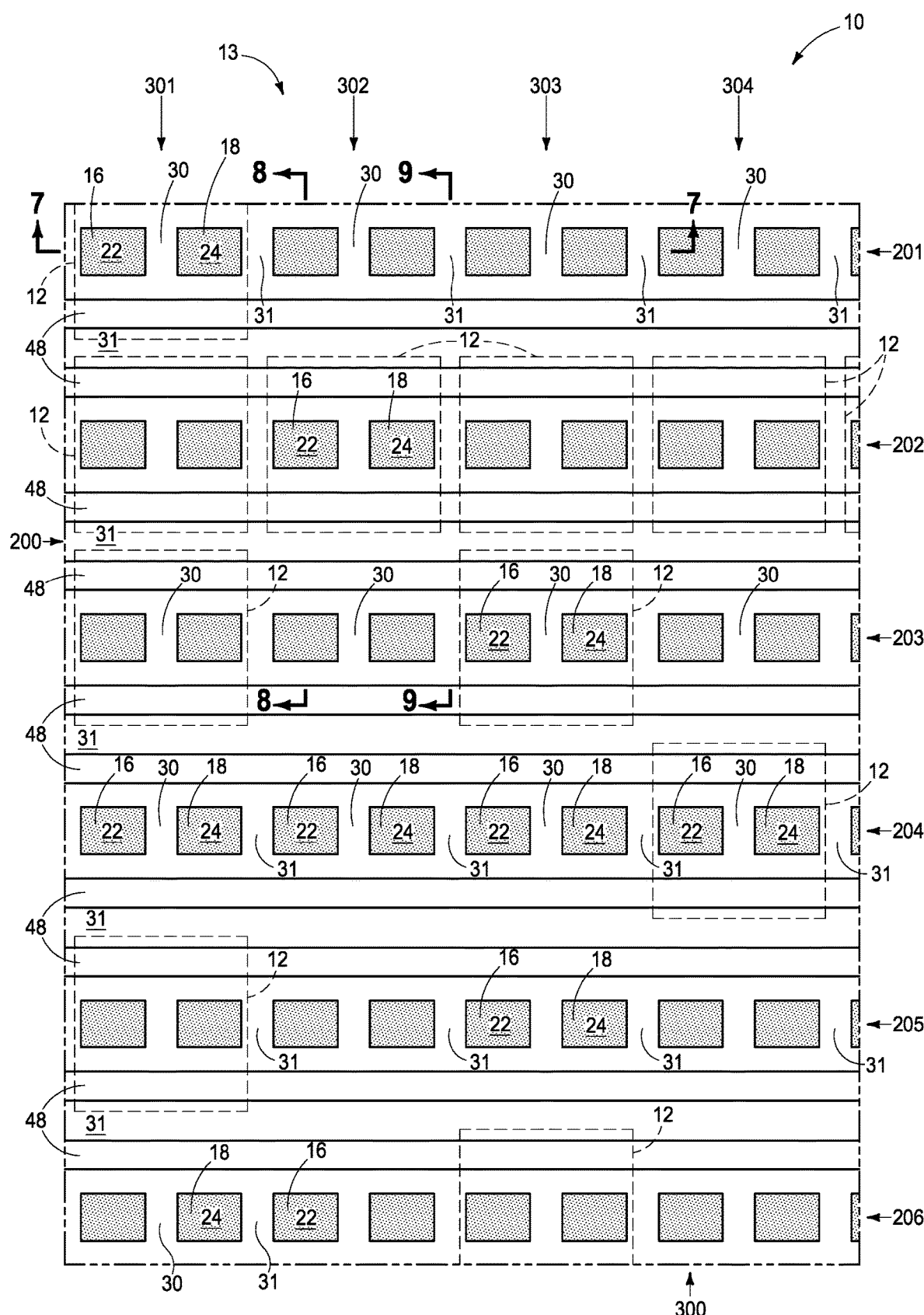
FIG. 6 is a diagrammatic top view of a predecessor construction to that of the FIG. 1 device in process in a method embodiment of the invention.
Figure 7:
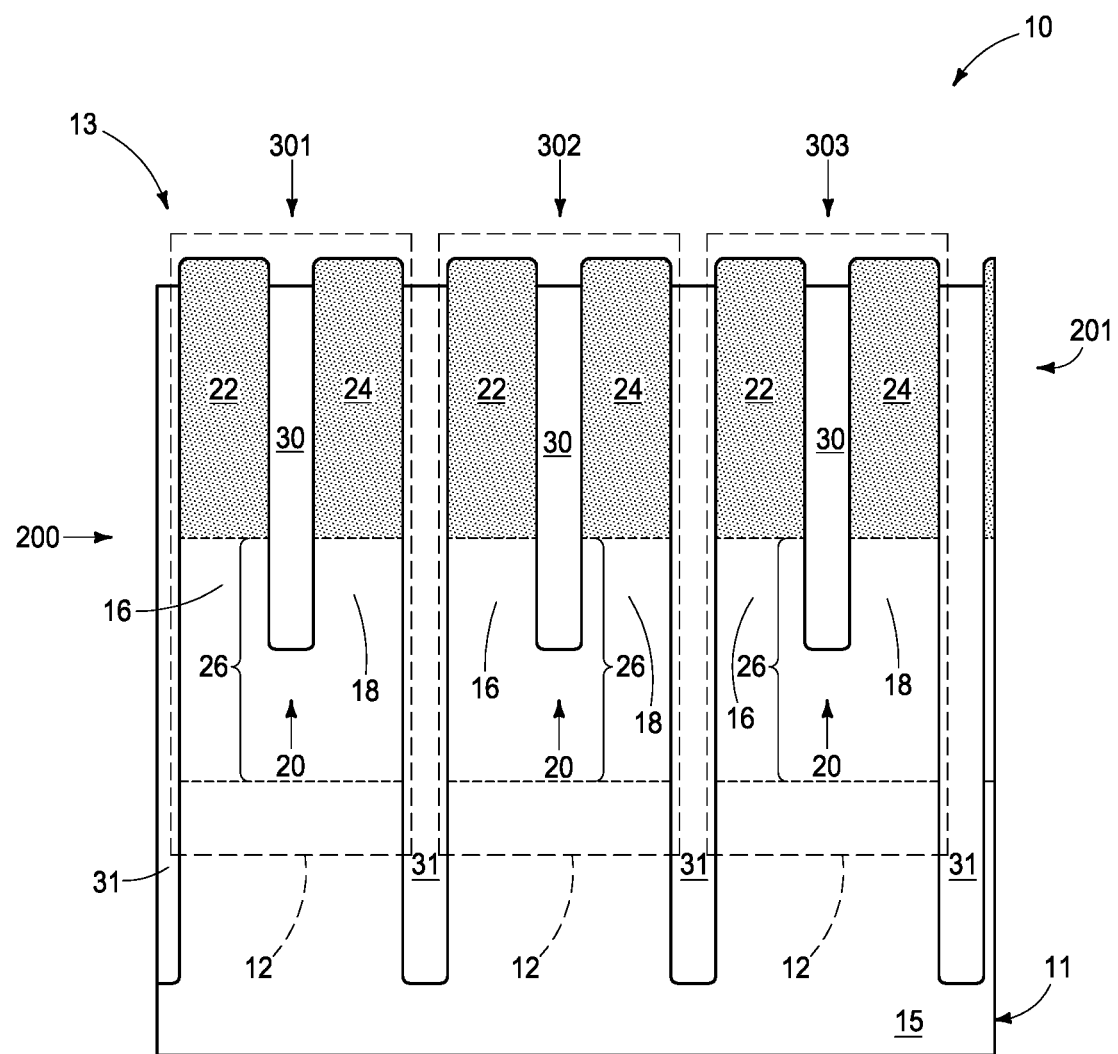
FIG. 7 is a cross-sectional view taken through line 7-7 in FIG. 6.
Figure 8:
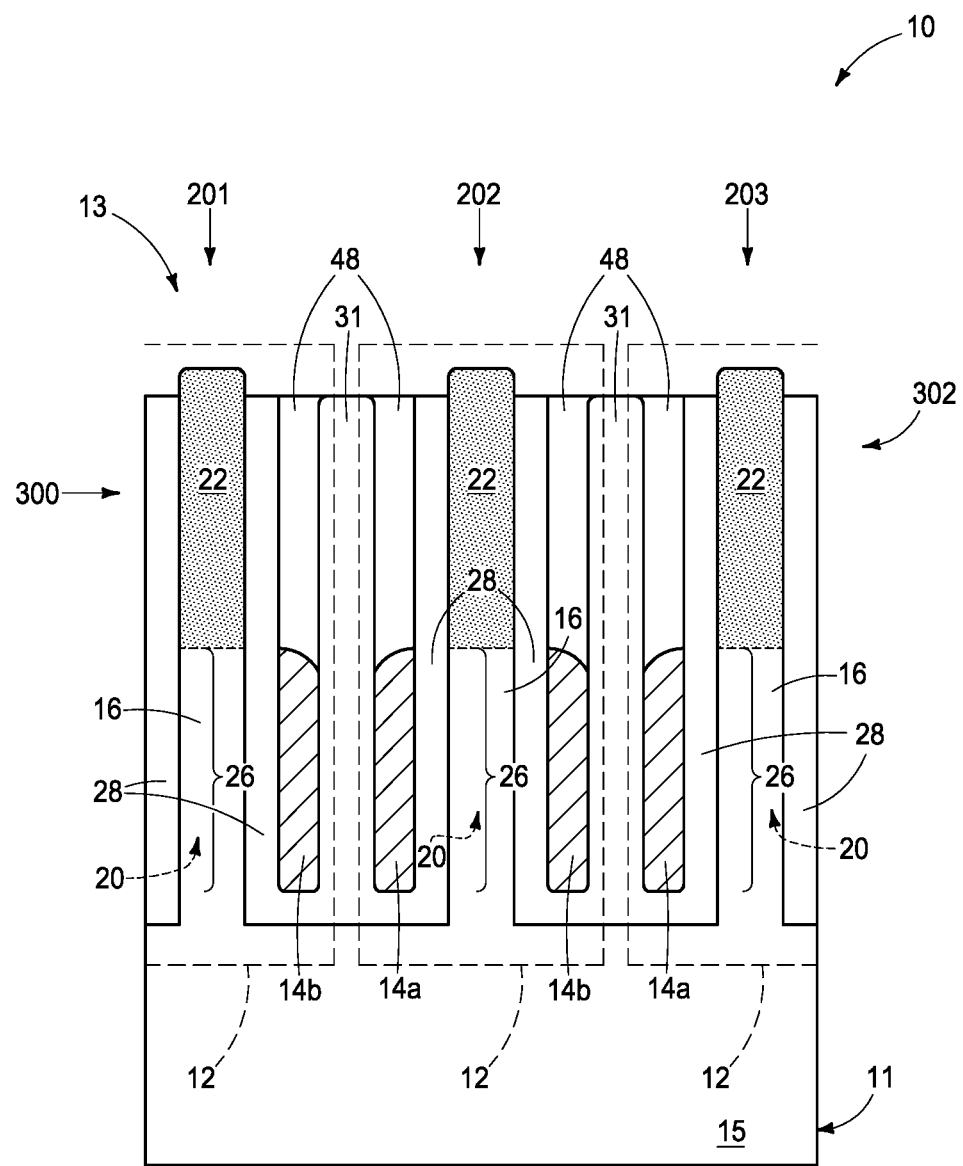
FIG. 8 is a cross-sectional view taken through line 8-8 in FIG. 6.
Figure 9:
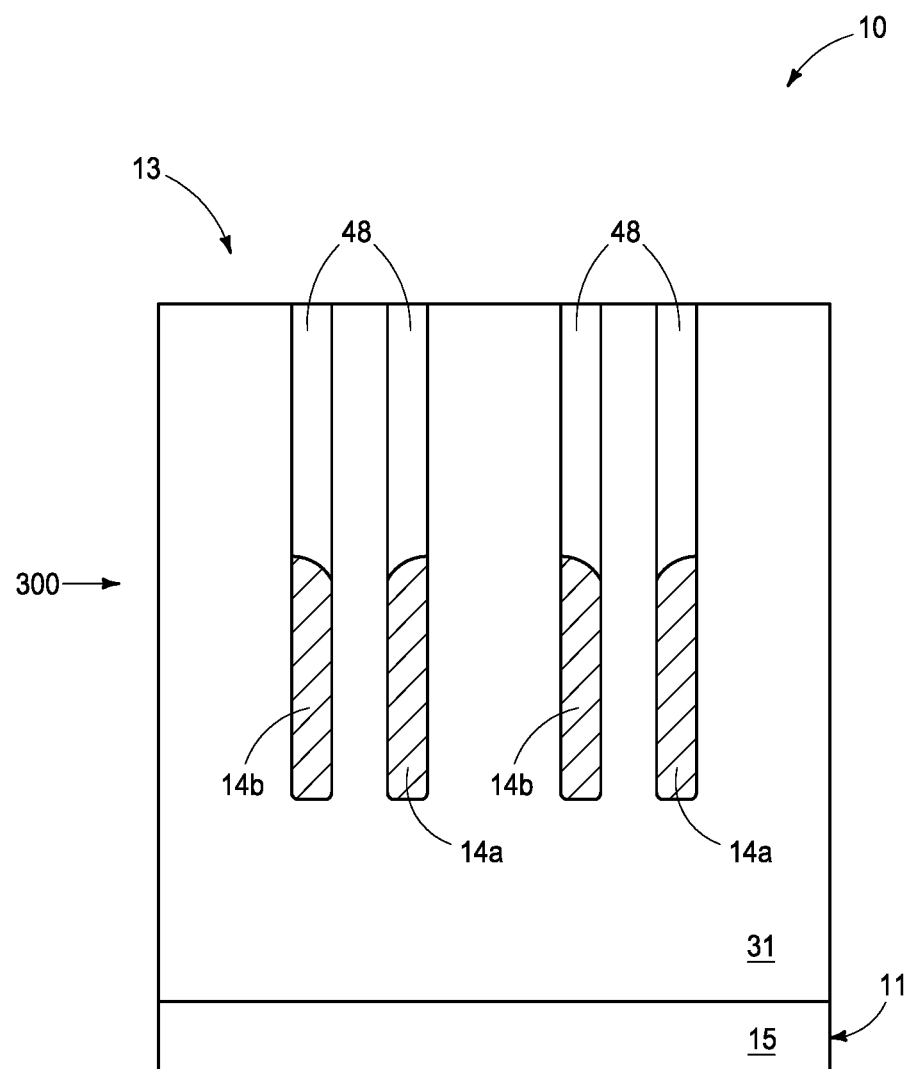
FIG. 9 is a cross-sectional view taken through line 9-9 in FIG. 6.

FIG. 5 diagrammatically illustrates a portion of memory array 13 comprising access lines 14a,b in rows 201, 202, and 203, and comprising sense lines 36 in columns 301, 302, and 303. Memory cells 75 are shown to comprise one of transistors 12 in combination with one of capacitors 50, with each such capacitor having one node directly electrically coupled to source/drain region 22 of access transistor 12 and another node directly electrically coupled to a cell plate 66. Example cell plate 66 may be at any suitable reference voltage, including by way of example, 0V, a power supply voltage $V_{CC}$, one half of $V_{CC}$, or the like, depending upon application.

Rows 201-203 extend to row driver circuitry 68 which by way of example is shown provided peripherally to memory array 13. Columns 301-303 extend to sense amplifier circuitry 70 which is also by way of example shown provided peripherally to memory array 13. Row driver circuitry 68 and sense amplifier circuitry 70 are examples of circuitry which may be provided peripherally to memory array 13, and in other embodiments other circuitry may be provided peripherally adjacent the memory array in addition to, or alternately to, row driver circuitry 68 and sense amplifier circuitry 70. Row driver circuitry 68 is typically electrically coupled to access lines and sense amplifier circuitry 70 is typically electrically couple with sense lines. Regardless, any of such circuitry may alternately and/or additionally be provided elevationally outward or elevationally inward of array structure 13.

Embodiments of the invention of methods used in forming an array of memory cells are next described with reference to FIGS. 6-32 in fabrication of a construction as exemplified by FIGS. 1-4. Like numerals have been used in the figures and as described above for like components and predecessor features, regions, and materials. Pitch multiplication may be used in forming any of the regions, features, or constructions shown and described herein.

Referring to FIGS. 6-9, such depicts a previously fabricated or provided substrate 10 comprising rows 201-206 and columns 301-304 of transistors 12. Source/drain regions 22 and 24 may project upwardly relative to surrounding material of substrate 10 as shown.

Figure 10:
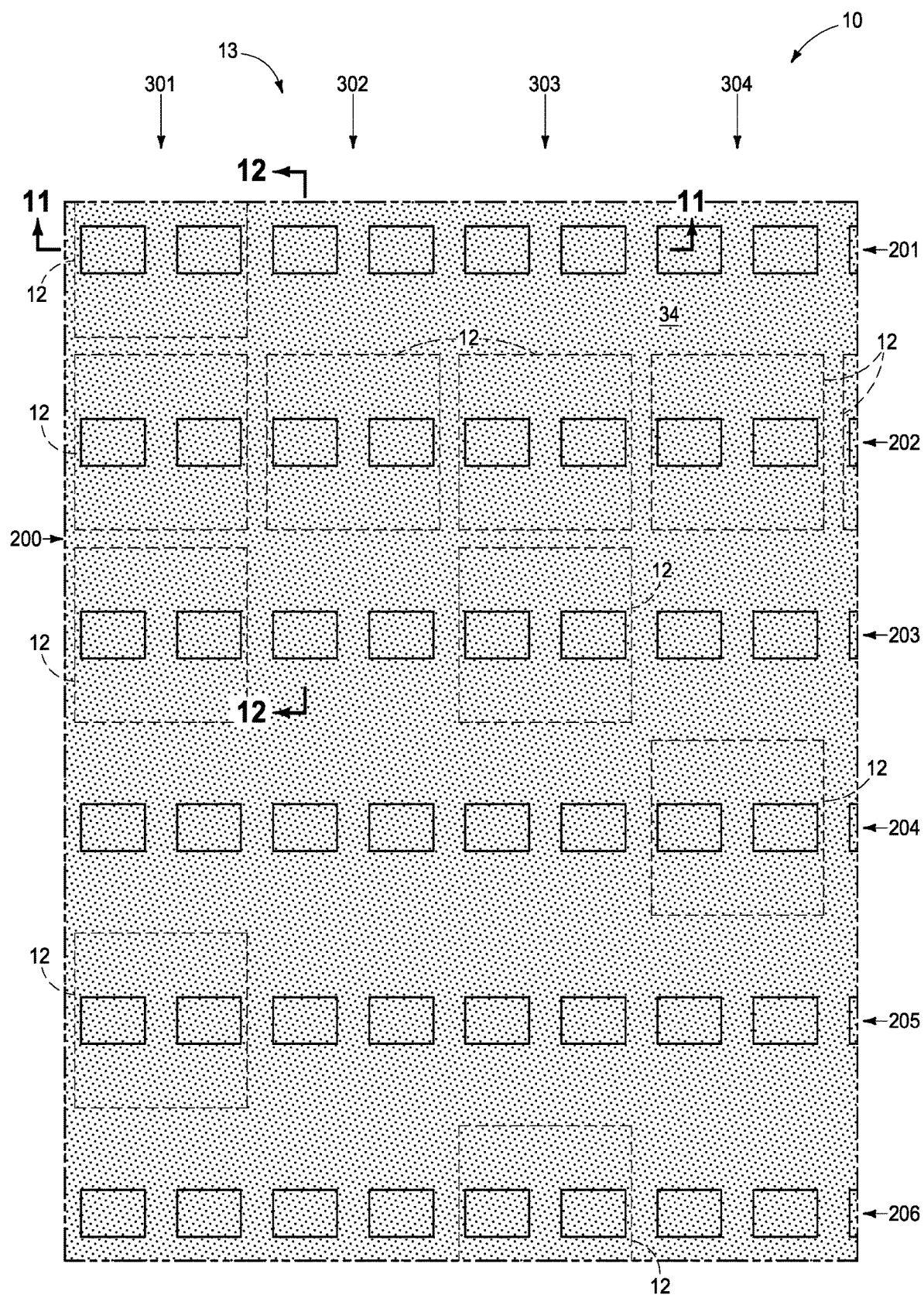
FIG. 10 is a view of the FIG. 6 construction at a processing step subsequent to that shown by FIG. 6.
Figure 11:
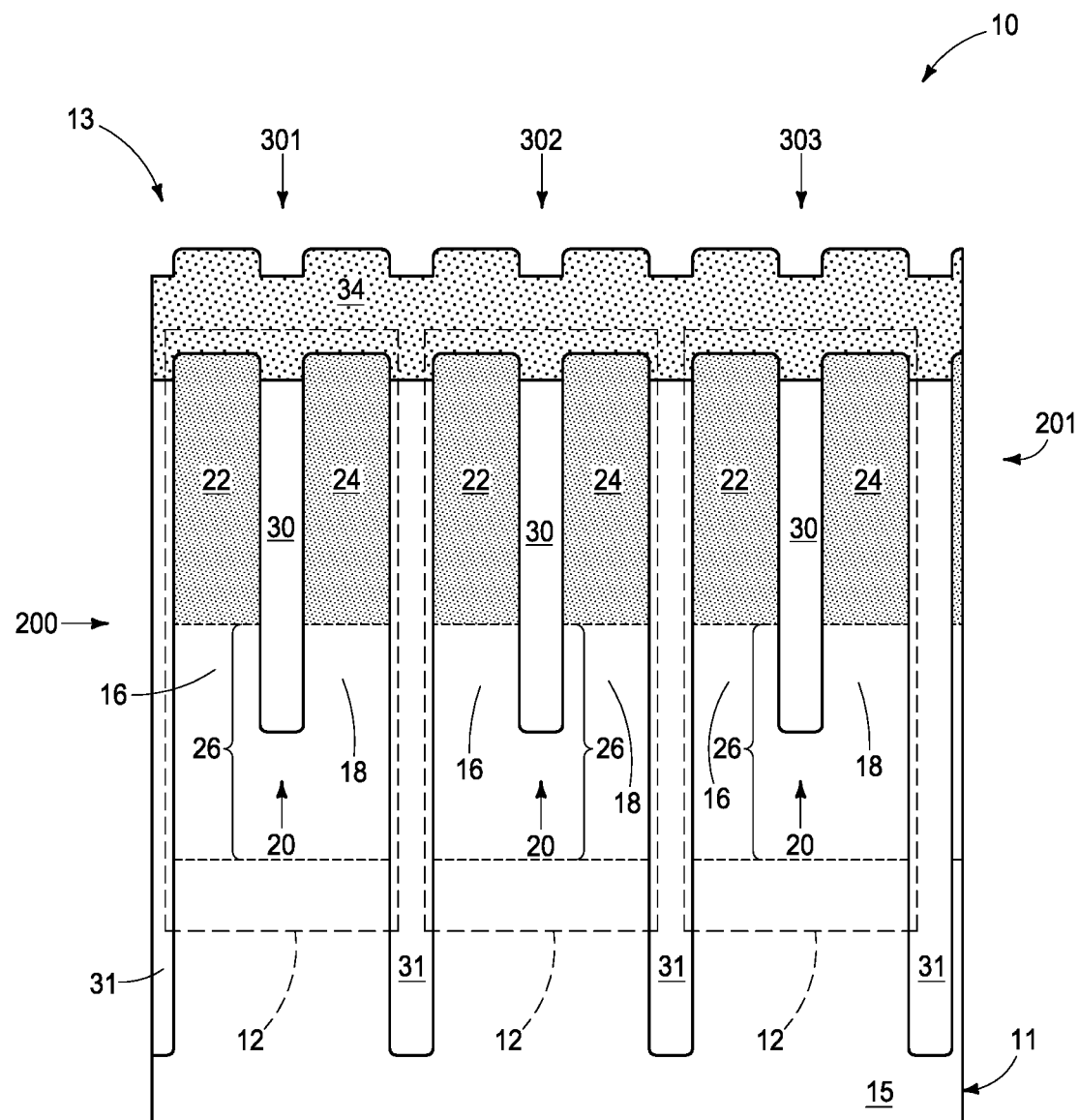
FIG. 11 is a cross-sectional view taken through line 11-11 in FIG. 10.
Figure 12:
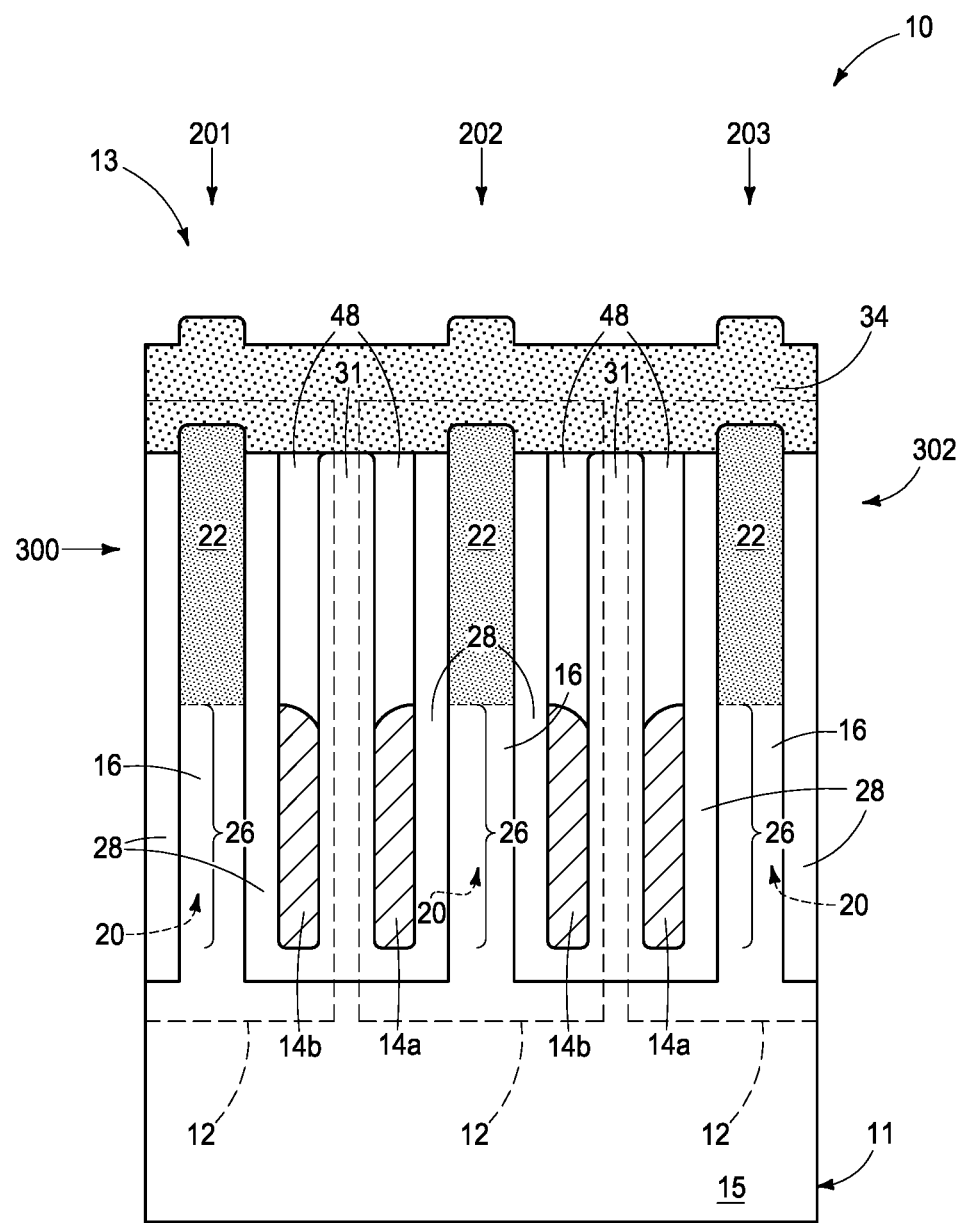
FIG. 12 is a cross-sectional view taken through line 12-12 in FIG. 10.

Referring to FIGS. 10-12, and in one embodiment, conductive material 34 has been formed above and electrically coupled to, and in one embodiment directly against and directly electrically coupled to, upper source/drain regions 22, 24 of first and second pedestals 16, 18, respectively. Conductive material 34 intra-transistor-shorts (i.e., internally within an individual transistor) and inter-transistor-shorts (i.e., between at least two different individual transistors) upper source/drain regions 22, 24 of first and second pedestals 16, 18, respectively, together. In one embodiment, an uppermost portion (i.e., at least) of conductive material 34 is conductively-doped semiconductive material.

Figure 13:
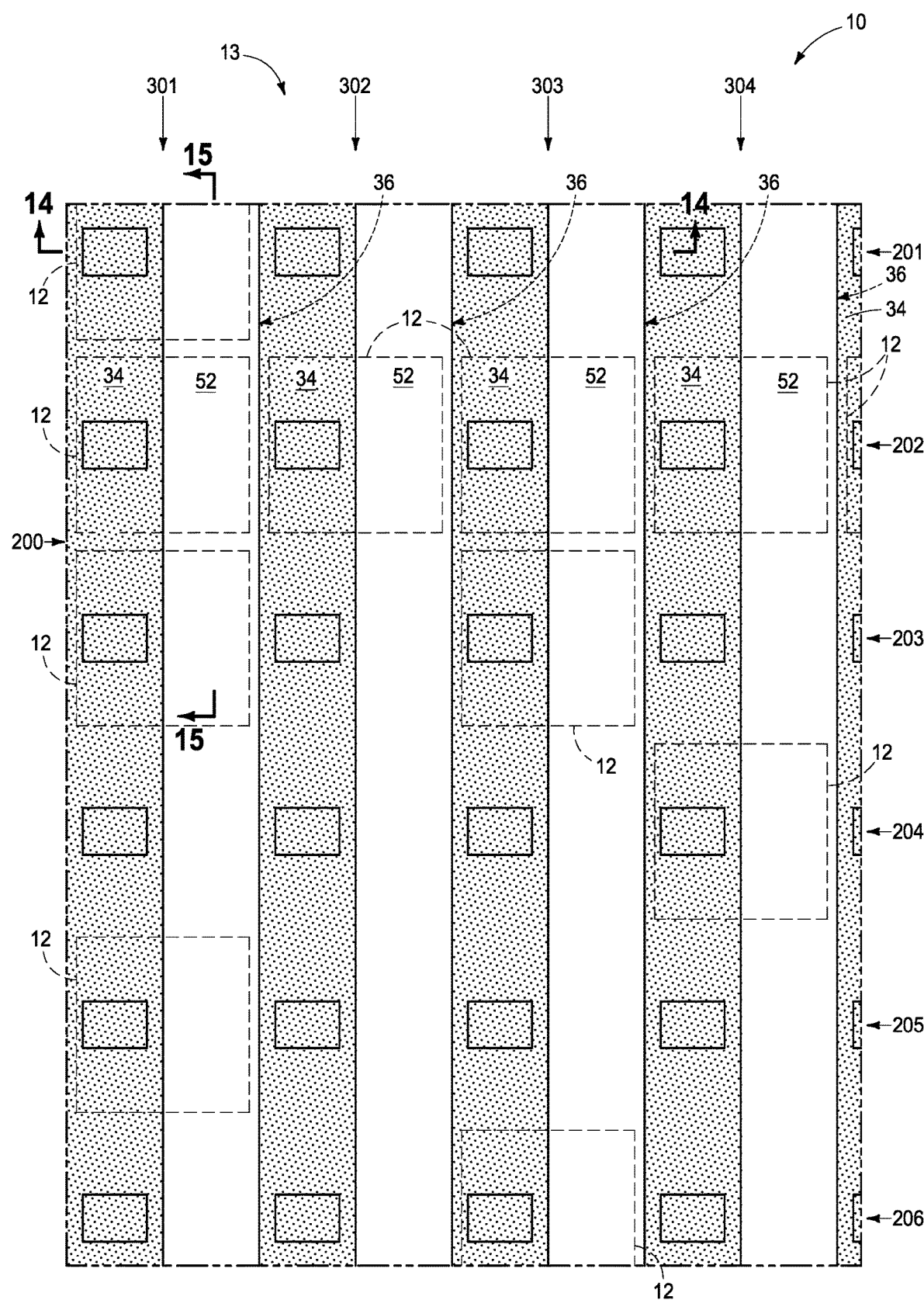
FIG. 13 is a view of the FIG. 10 construction at a processing step subsequent to that shown by FIG. 10.
Figure 14:
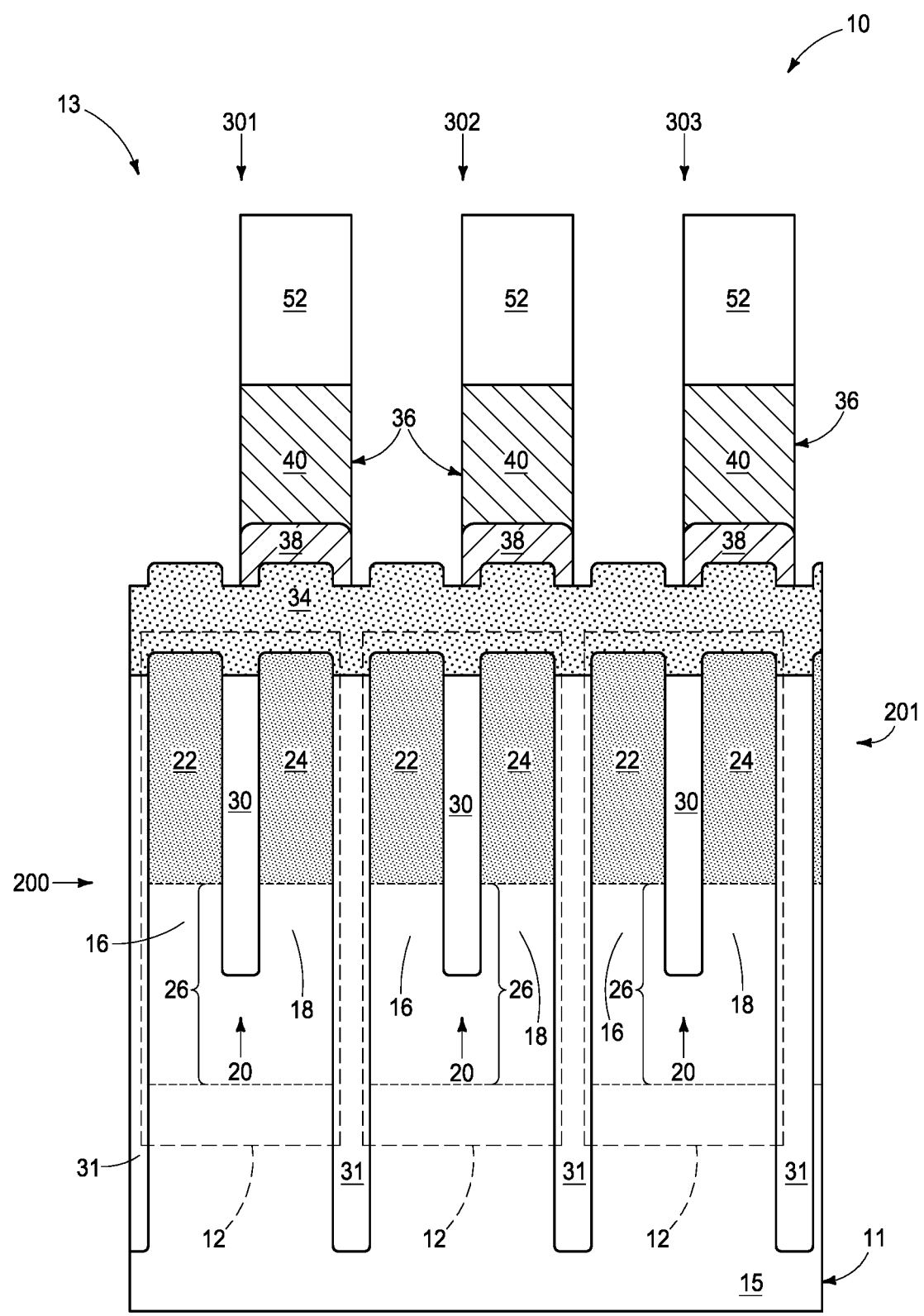
FIG. 14 is a cross-sectional view taken through line 14-14 in FIG. 13.
Figure 15:
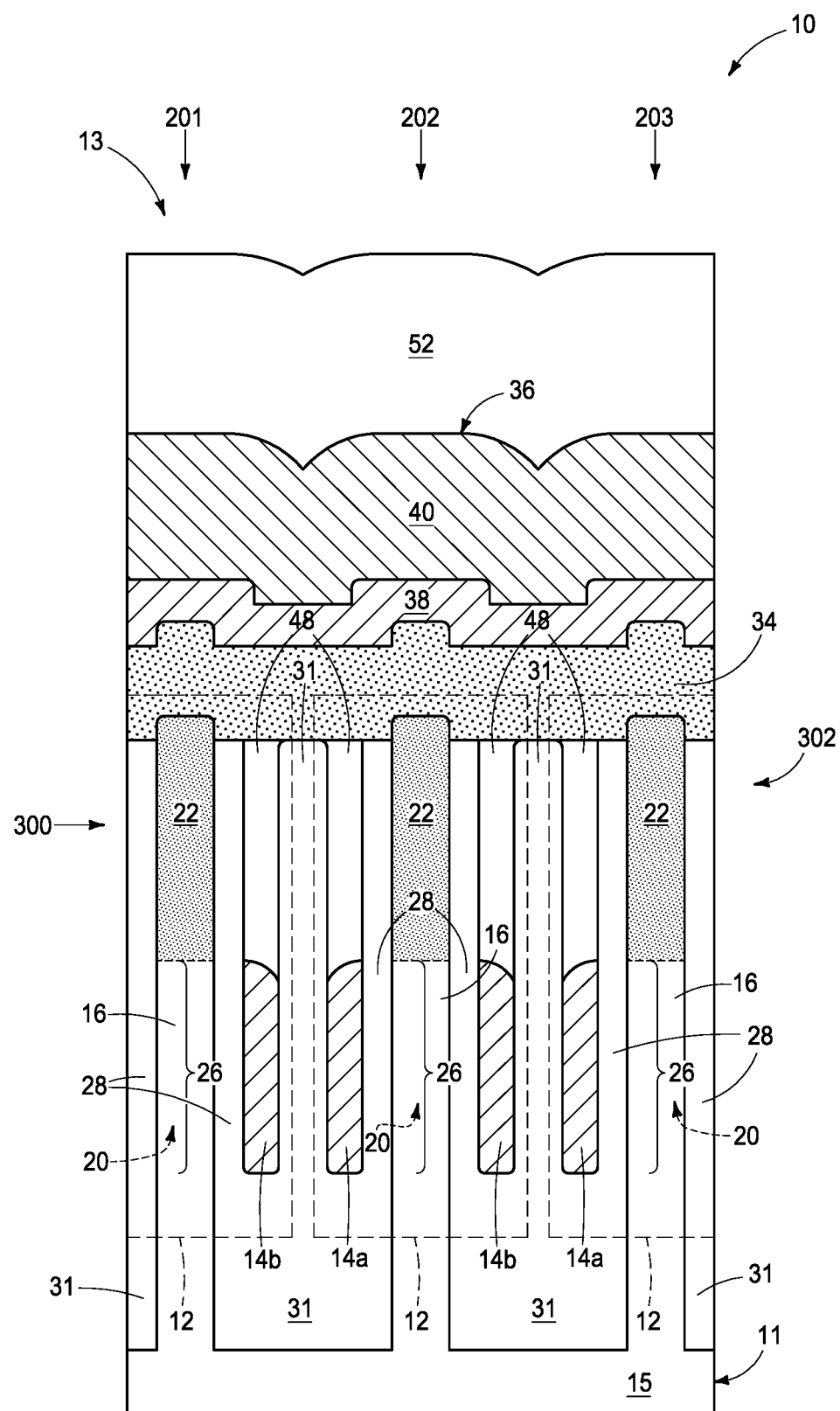
FIG. 15 is a cross-sectional view taken through line 15-15 in FIG. 13.

Referring to FIGS. 13-15, sense lines 36 have been formed to longitudinally extend in column direction 300, in one embodiment directly against conductive material 34 (when present), and are individually directly above upper source/drain regions 24 of multiple second pedestals 18. In one embodiment, sense lines 36 (including insulator material 52 when over conductor material 40) are photolithographically patterned (e.g., using photoresist) in a masking step that ultimately results in fabrication of the FIGS. 13-15 construction.

Figure 16:
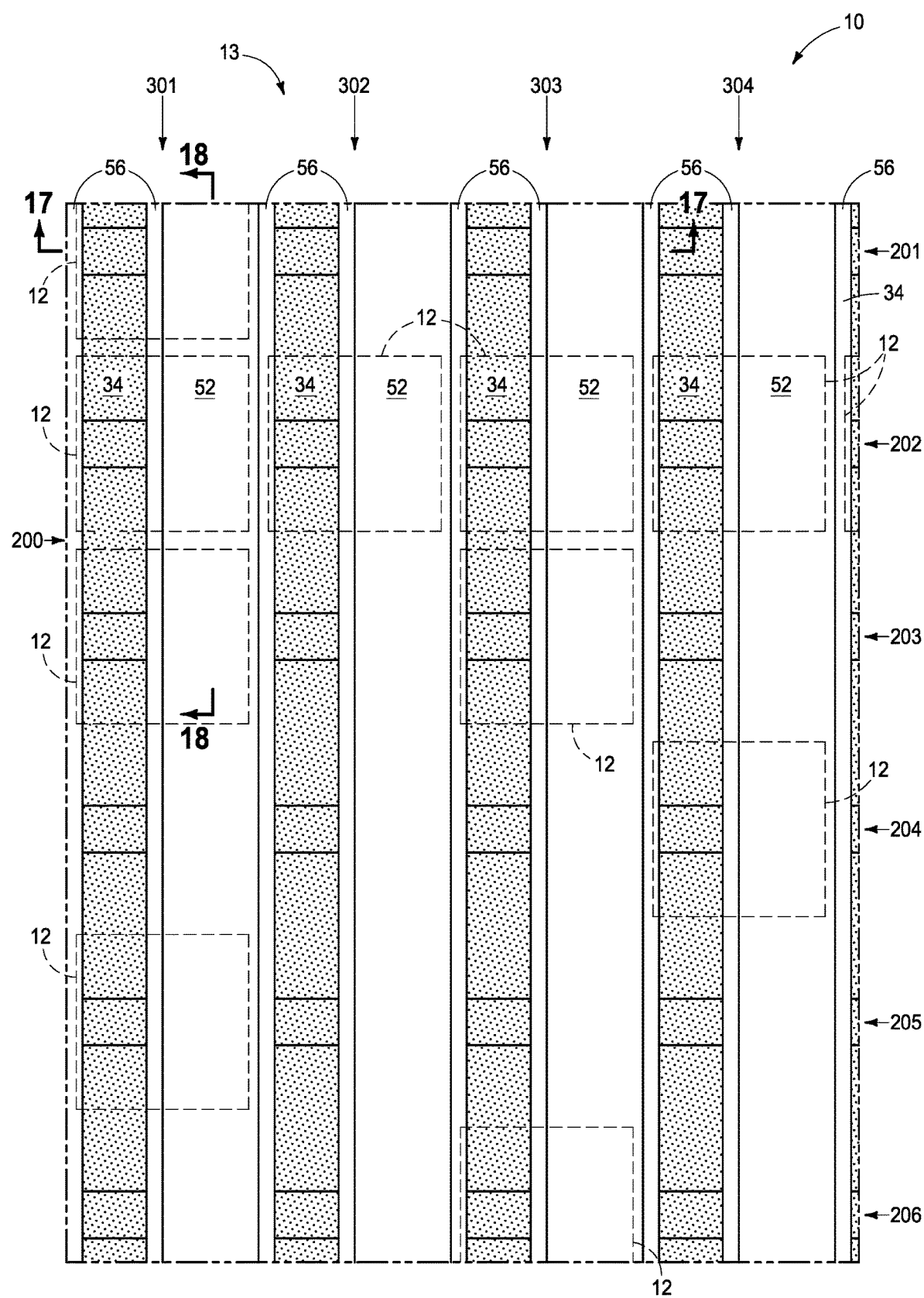
FIG. 16 is a view of the FIG. 13 construction at a processing step subsequent to that shown by FIG. 13.
Figure 17:
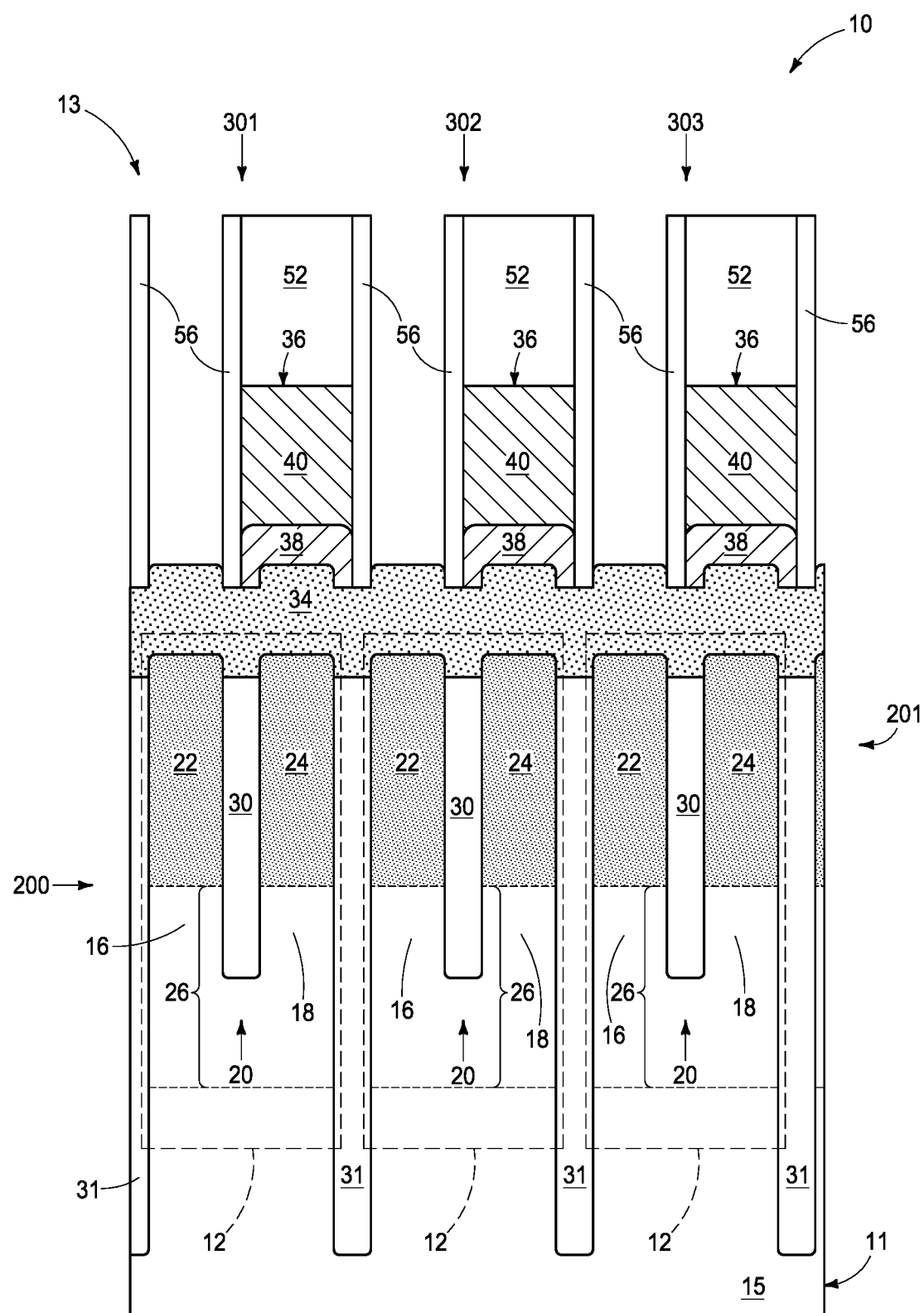
FIG. 17 is a cross-sectional view taken through line 17-17 in FIG. 16.
Figure 18:
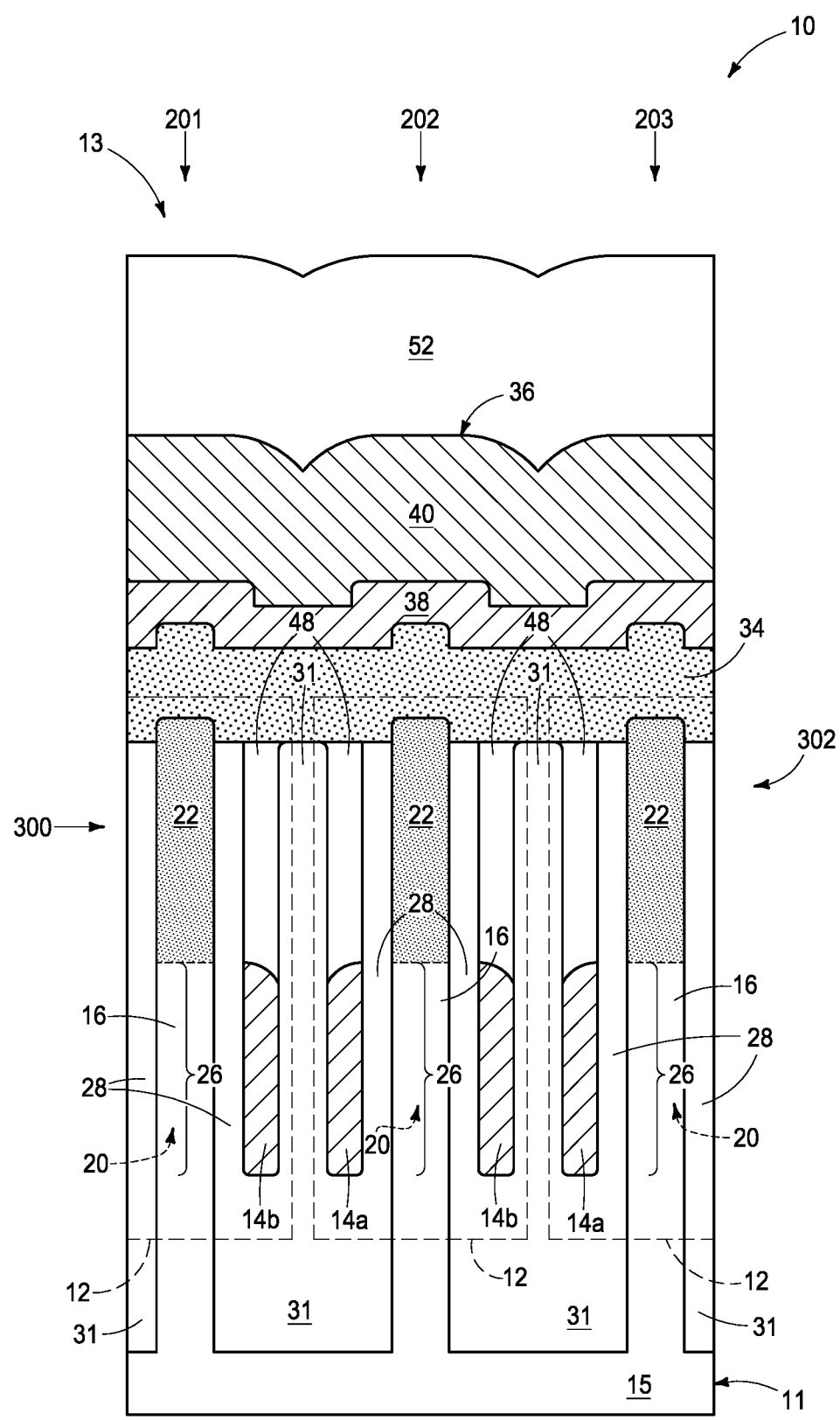
FIG. 18 is a cross-sectional view taken through line 18-18 in FIG. 16.

Referring to FIGS. 16-18, and in one embodiment, sacrificial material 56 has been formed over sidewalls of sense lines 36. Such may be formed, by way of example, by deposition of a conformal layer (e.g., about 6 nm thickness) of sacrificial material 56, followed by mask-less anisotropic etching thereof to remove such from largely being over horizontal surfaces. In some embodiments, all of sacrificial material 56 is ultimately removed from the substrate. Material 56 may be any of one or more of dielectric, semiconductive, and conductive. One example material is $Si_3N_4$.

Figure 19:
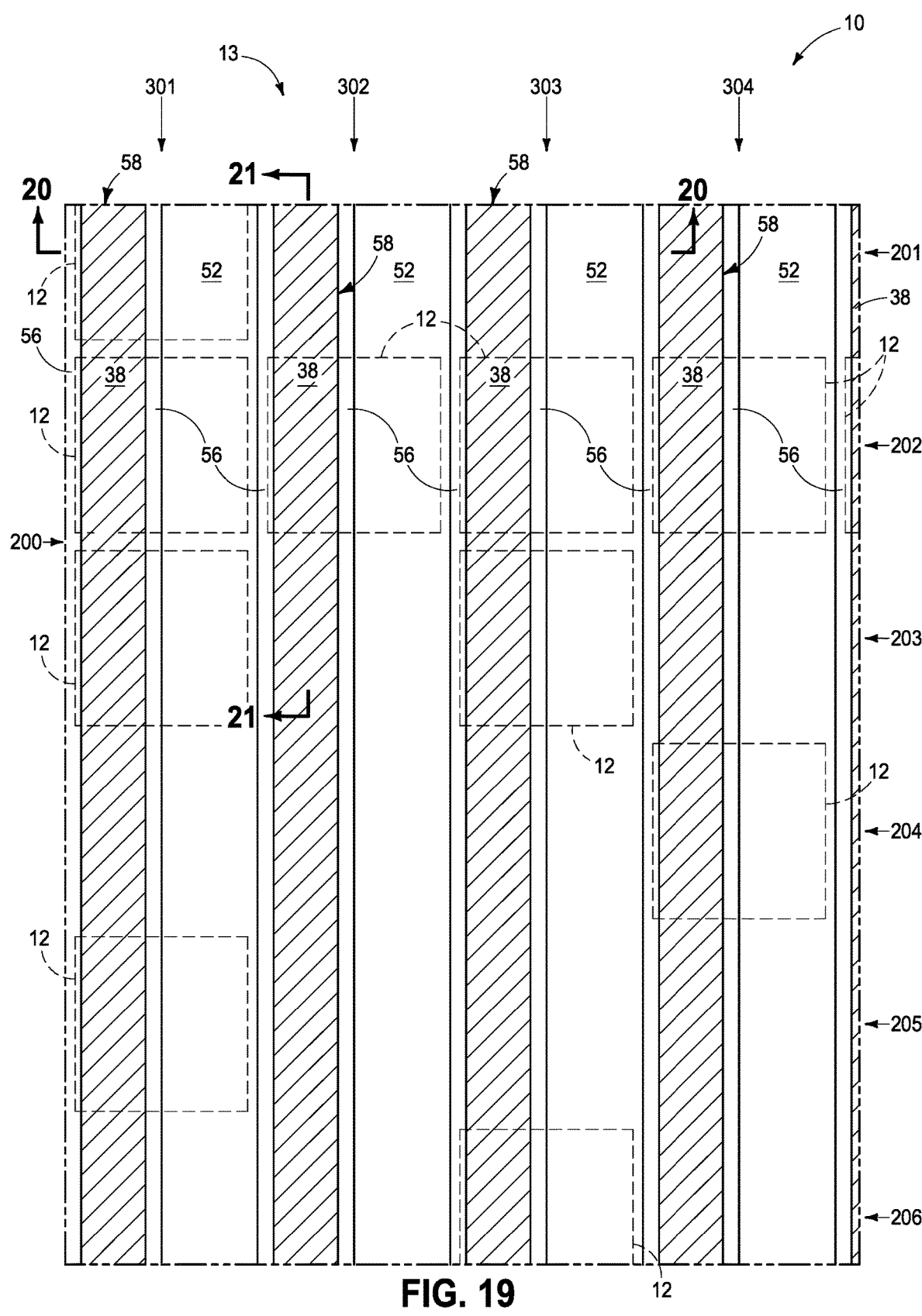
FIG. 19 is a view of the FIG. 16 construction at a processing step subsequent to that shown by FIG. 16.
Figure 20:
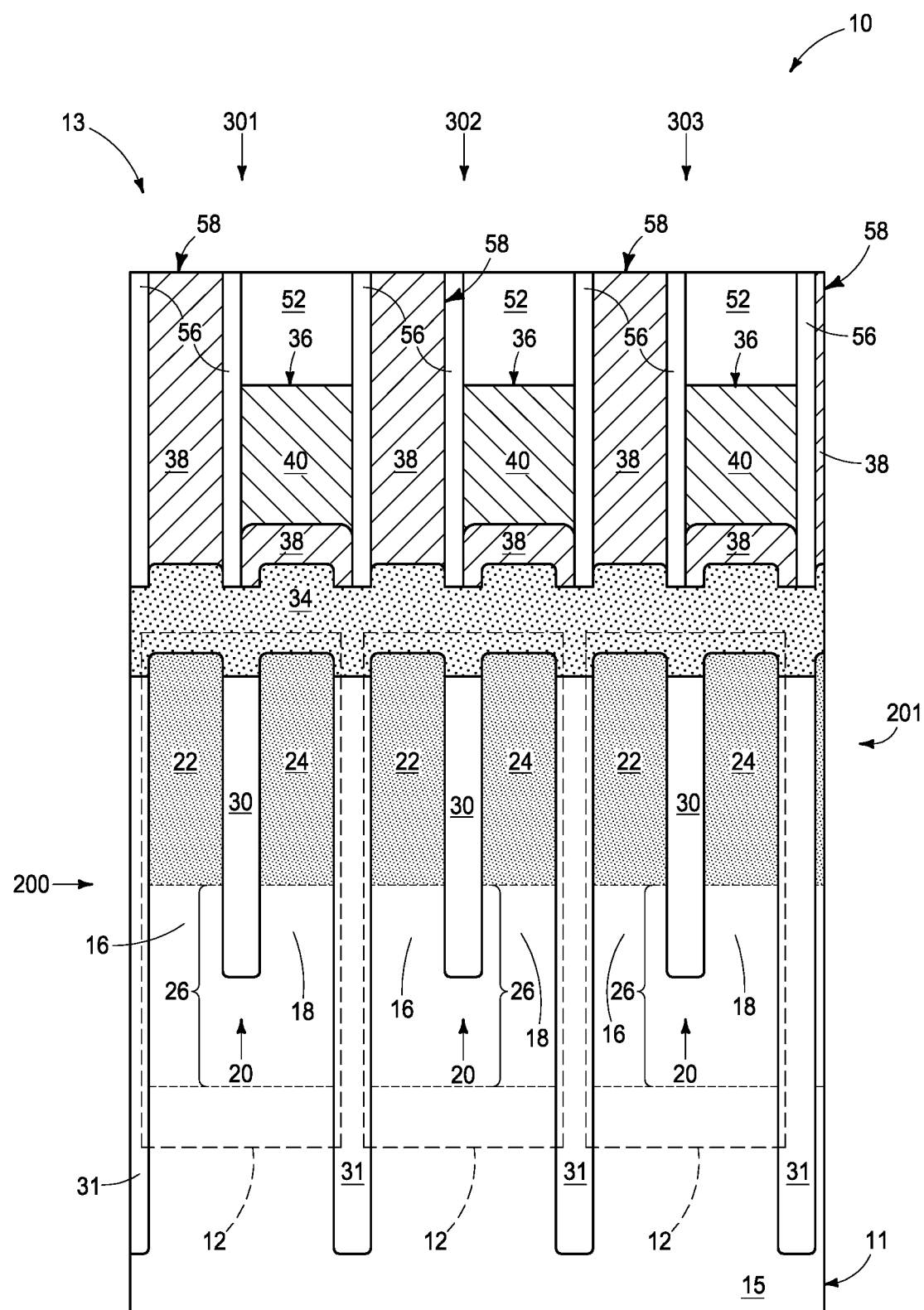
FIG. 20 is a cross-sectional view taken through line 20-20 in FIG. 19.
Figure 21:
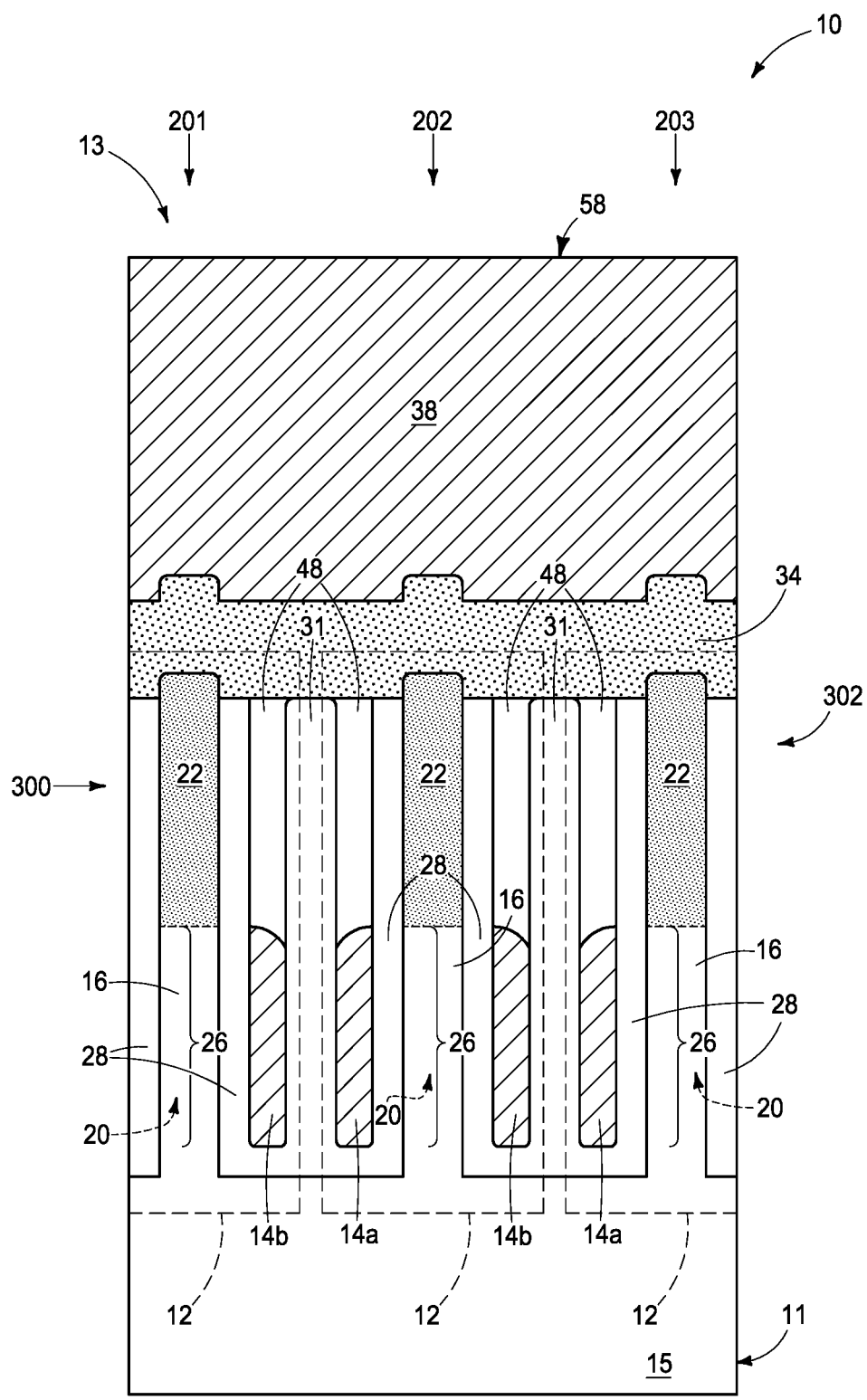
FIG. 21 is a cross-sectional view taken through line 21-21 in FIG. 19.

Referring to FIGS. 19-21, sense lines 36 have been used in forming conductor-material (e.g., 38) lines 58 in column direction 300 that are self-aligned in row direction 200 by and between immediately-adjacent of sense lines 36, with in one embodiment sacrificial material 56 being laterally between conductor-material lines 58 and sense lines 36. Such may be formed by over-filling the trench-like openings between sacrificial material 56 as shown in FIGS. 16 and 17 with conductor material 38, followed by polishing conductor material 38 back to elevationally-outermost surfaces of substrate 10. Conductor-material lines 58 are individually continuous in column direction 300 directly above and electrically coupled to upper source/drain regions 22 of multiple first pedestals 16. In one embodiment and as shown where conductive material 34 is present, individual conductor-material lines 58 are above and in some embodiments directly electrically coupled to upper source/drain regions 22 through conductive material 34.

Figure 22:
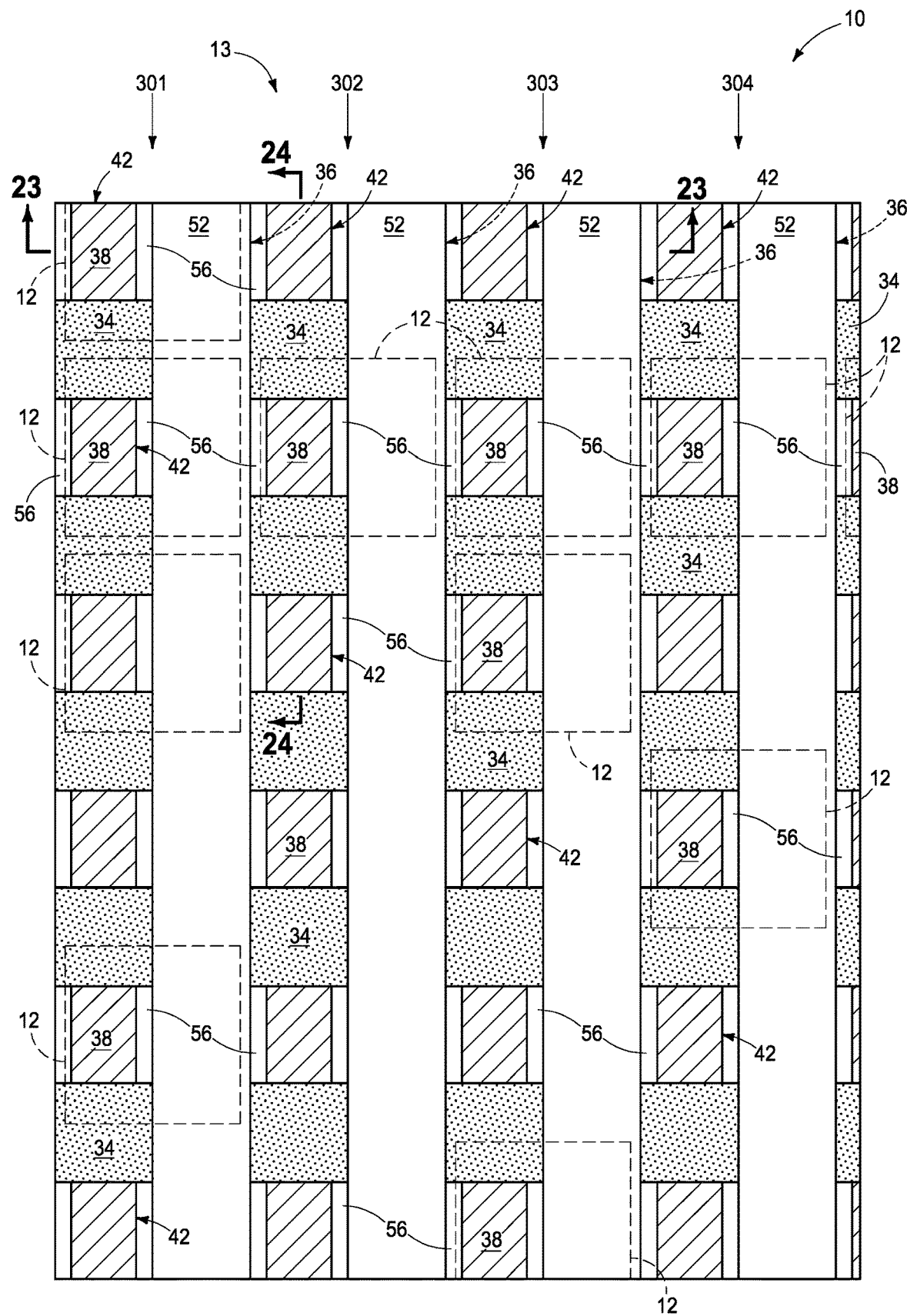
FIG. 22 is a view of the FIG. 19 construction at a processing step subsequent to that shown by FIG. 19.
Figure 23:
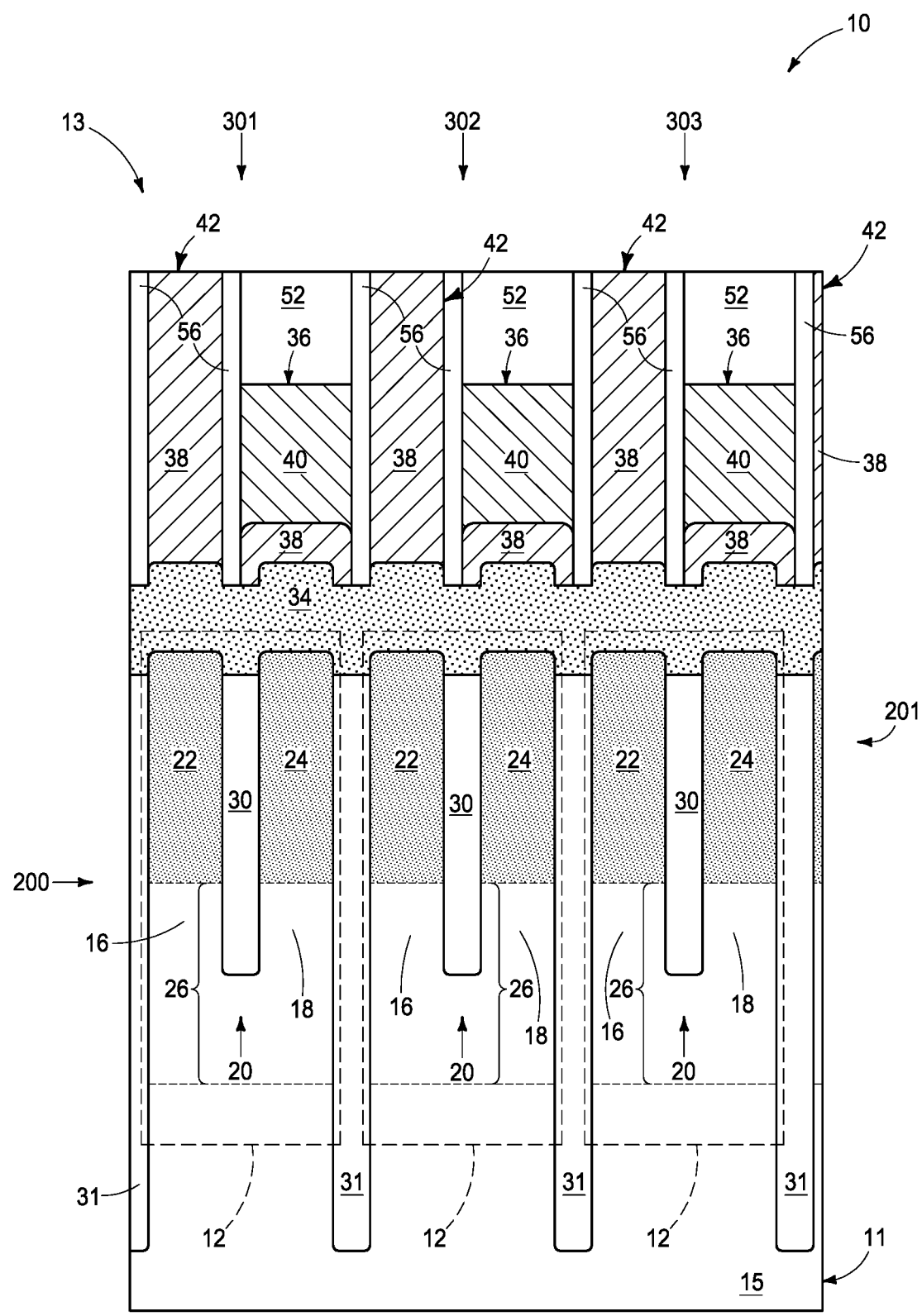
FIG. 23 is a cross-sectional view taken through line 23-23 in FIG. 22.
Figure 24:
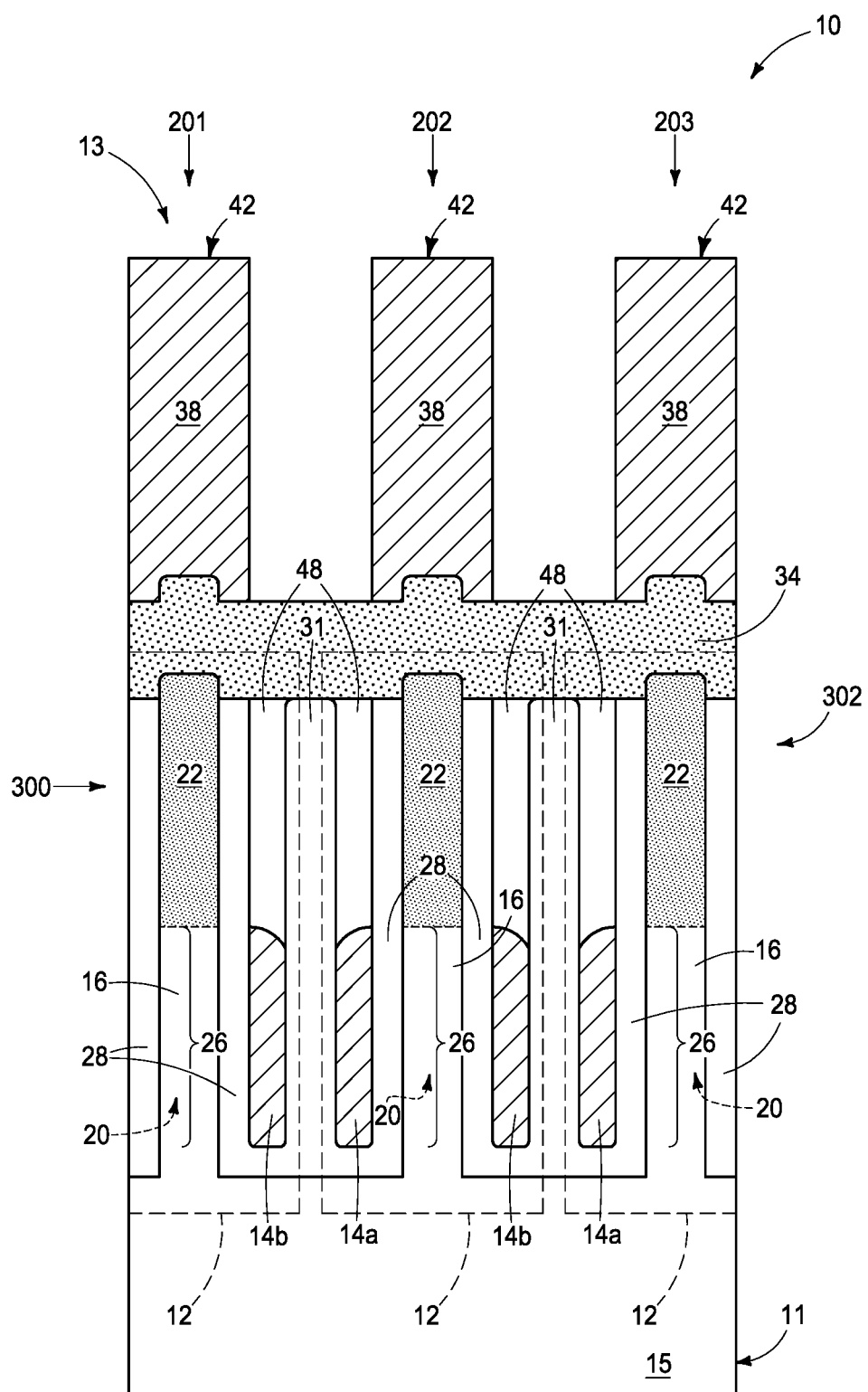
FIG. 24 is a cross-sectional view taken through line 24-24 in FIG. 22.

Referring to FIGS. 22-24, conductor material 38 of conductor-material lines 58 (no longer shown) has been patterned through (e.g., using etching) to form elevationally-extending vias 42 from conductor-material lines 58. Sacrificial material 56 (when present and in one embodiment) is laterally between remaining conductor material 38 and sense lines 36 after patterning through conductor material 38. In one embodiment and as shown, such patterning also occurs through sacrificial material 56. For example, and by way of example only, the patterning through conductor material 38 may comprise use of a patterned sacrificial masking material (not shown) in a masking step, with such patterning through sacrificial material 56 occurring using the patterned masking material in the masking step. Regardless, in one embodiment the act of patterning through conductor material 38 uses photoresist. By way of example only, a hard-masking material (not shown) might be provided above materials 38, 52, and 56, with photoresist provided thereover. Such photoresist may be patterned to pattern the hard-masking material, followed removal of the photoresist, and subsequent etching of underlying material using the hard-masking material as a mask. Regardless, where conductive material 34 is used, elevationally-extending vias 42 are intra-transistor-shorted and inter-transistor-shorted thereby in one embodiment where at this point in the process conductive material 34 has not been etched completely there-through.

Figure 25:
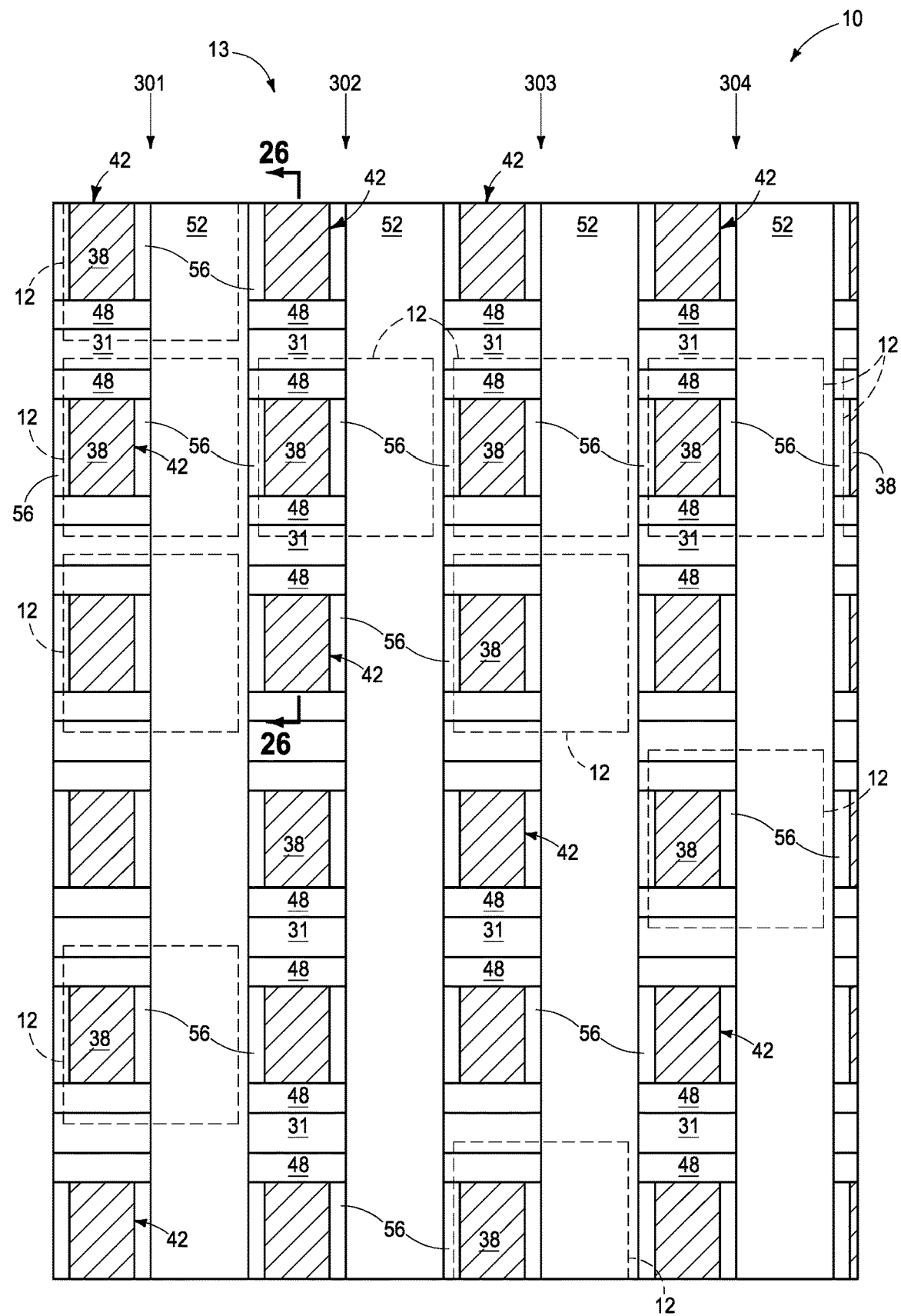
FIG. 25 is a view of the FIG. 22 construction at a processing step subsequent to that shown by FIG. 22.
Figure 26:
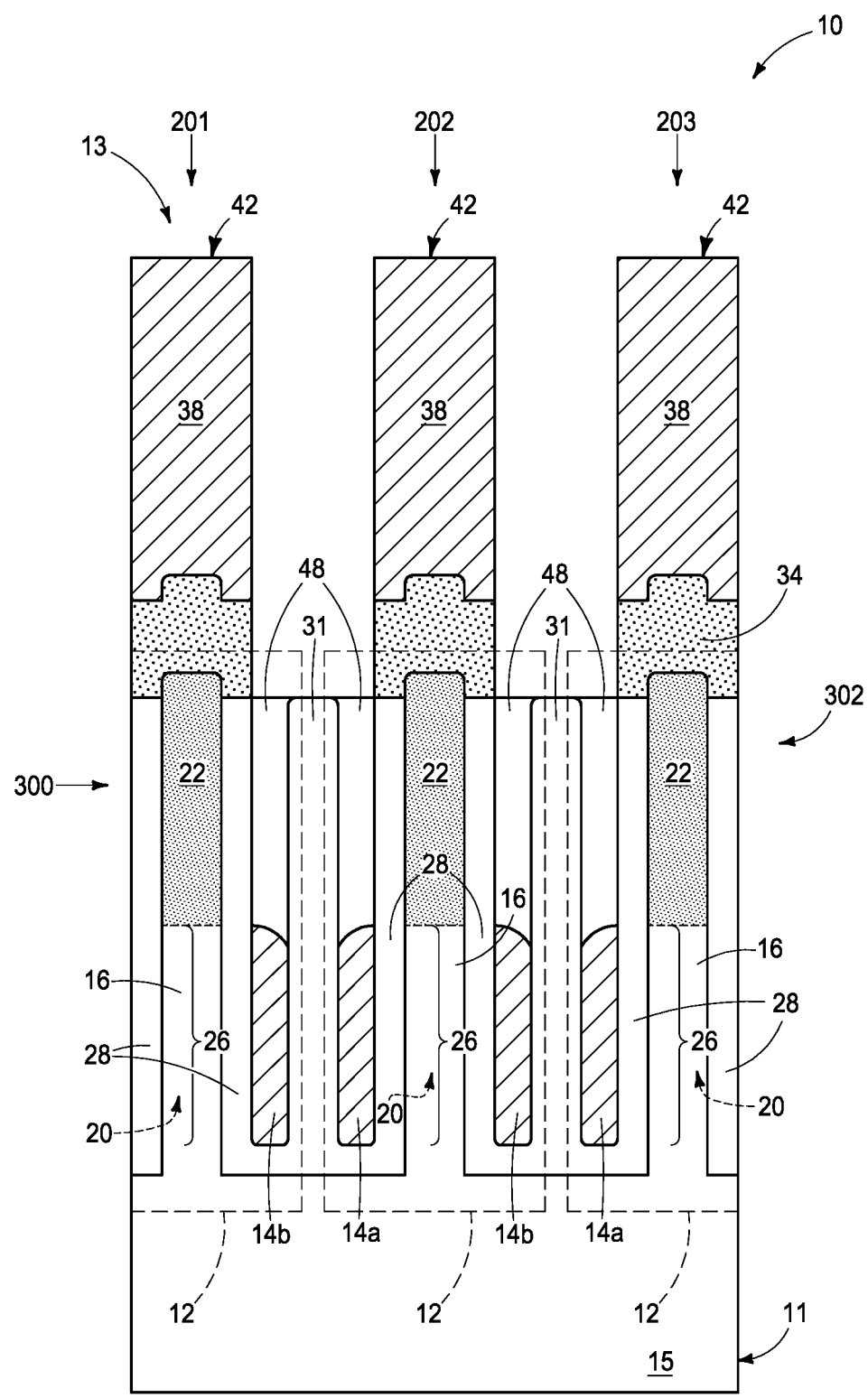
FIG. 26 is a cross-sectional view taken through line 26-26 in FIG. 25.

Referring to FIGS. 25 and 26 and as shown where conductive material 34 is used, patterning has been conducted through conductive material 34 using sense lines 36, sacrificial material 56 that is laterally between remaining conductor material 38 and sense lines 36, and spaced elevationally-extending vias 42 as a first mask. In one embodiment and as shown, such first mask comprises insulator material 52 atop sense lines 36 and that remains as part of a finished construction of the array. In one embodiment and as shown where conductive material 34 is used, spaced elevationally-extending vias 42 electrically couple and in one embodiment directly electrically couple, to upper source/drain regions 22 of first pedestals 16. Alternately, conductive material 34 may be considered as part of conductive vias 42. In one embodiment, material of lowest portions of the spaced elevationally-extending vias is conductively-doped semiconductor material (e.g., conductively-doped polysilicon where conductive material 34 comprises such). Regardless, in one embodiment, lowest portions of each of the sense lines and the spaced elevationally-extending vias are of the same composition (e.g., material 34) relative one another.

Figure 27:
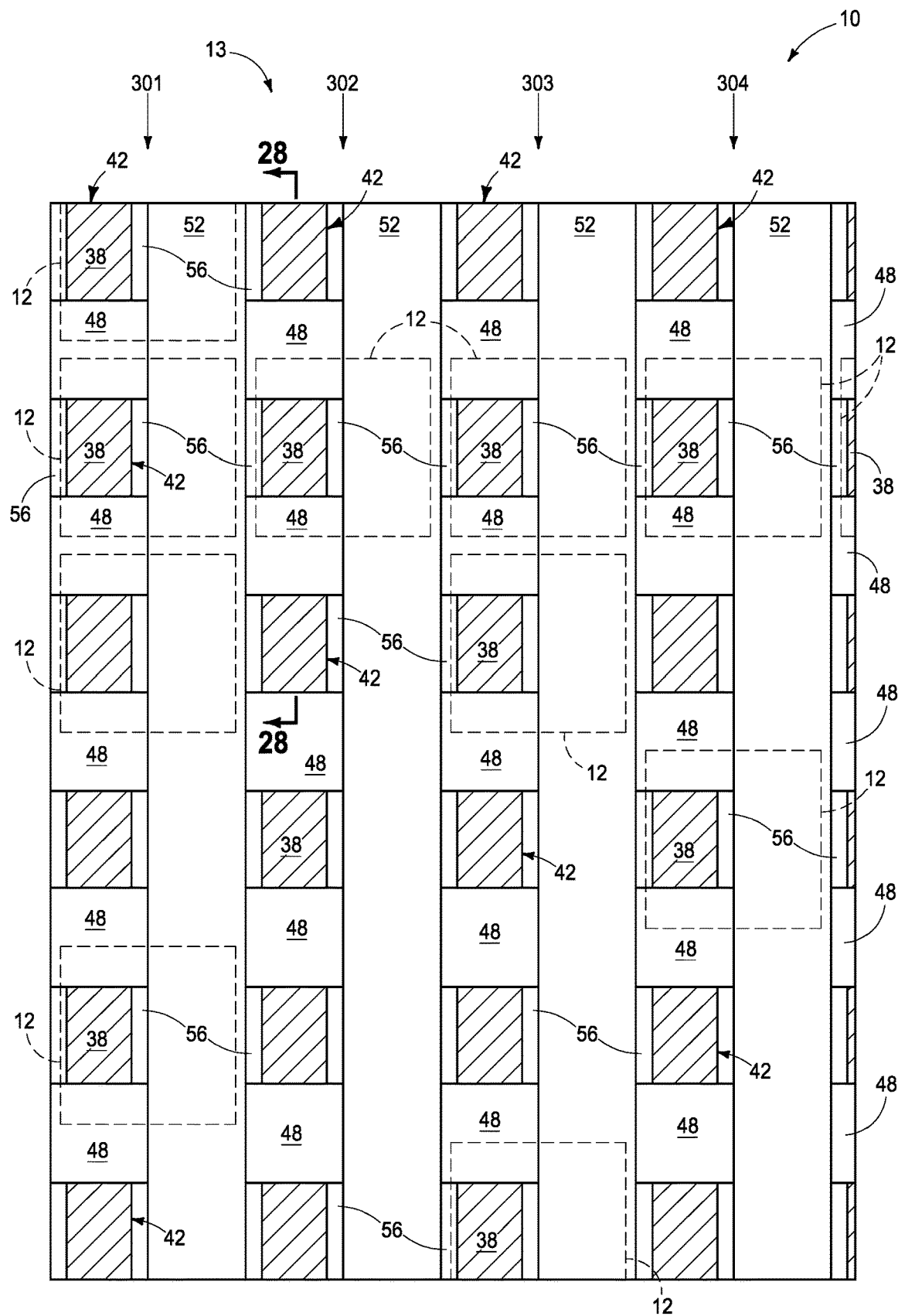
FIG. 27 is a view of the FIG. 25 construction at a processing step subsequent to that shown by FIG. 25.
Figure 28:
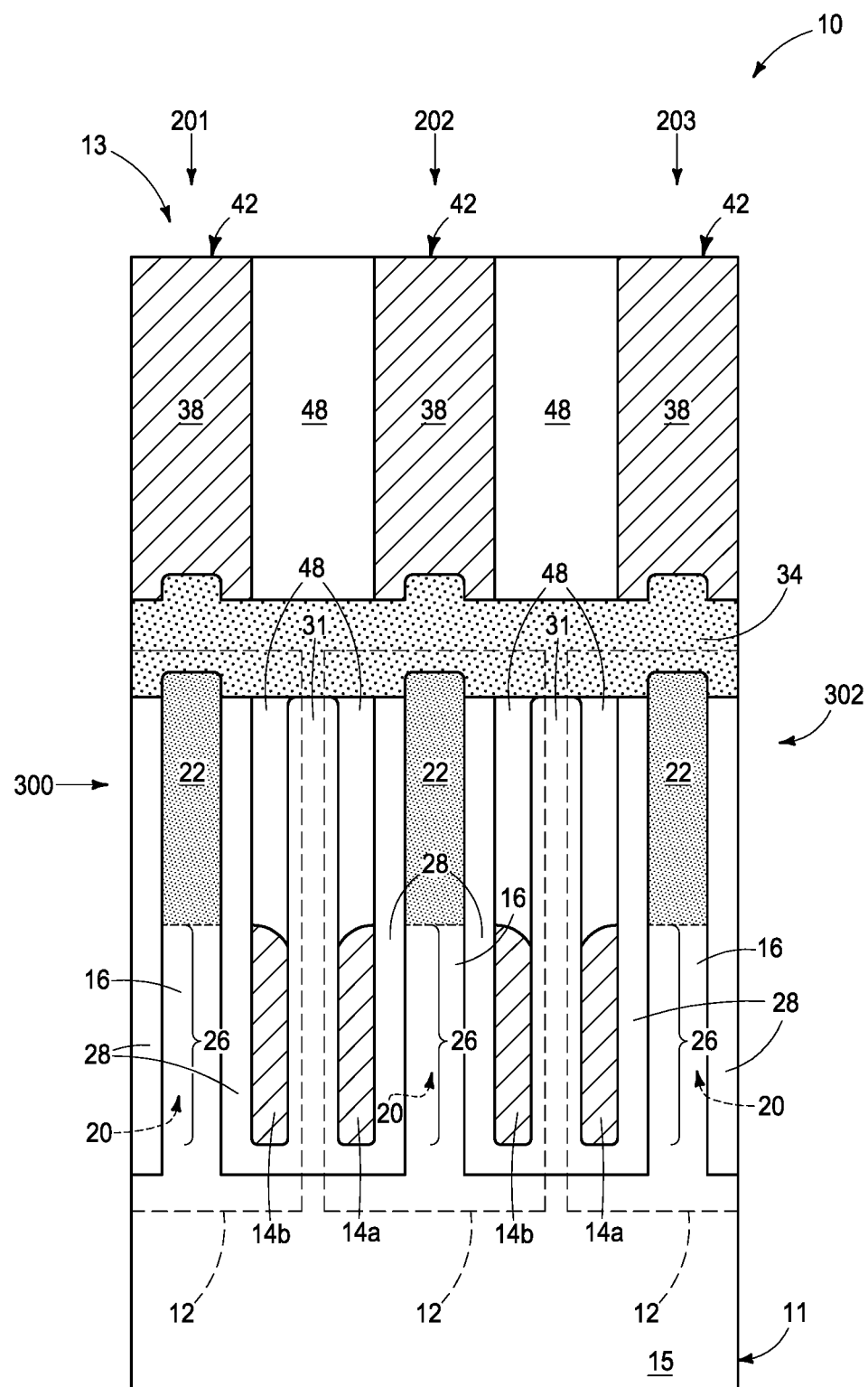
FIG. 28 is a cross-sectional view taken through line 28-28 in FIG. 27.

Referring to FIGS. 27 and 28, insulator material 48 has been formed in spaces between spaced elevationally-extending vias 42 (e.g., by over-filling the openings as shown in FIGS. 25 and 26 with material 48, followed by polishing material 48 back to elevationally-outermost surfaces of substrate 10).

Figure 29:
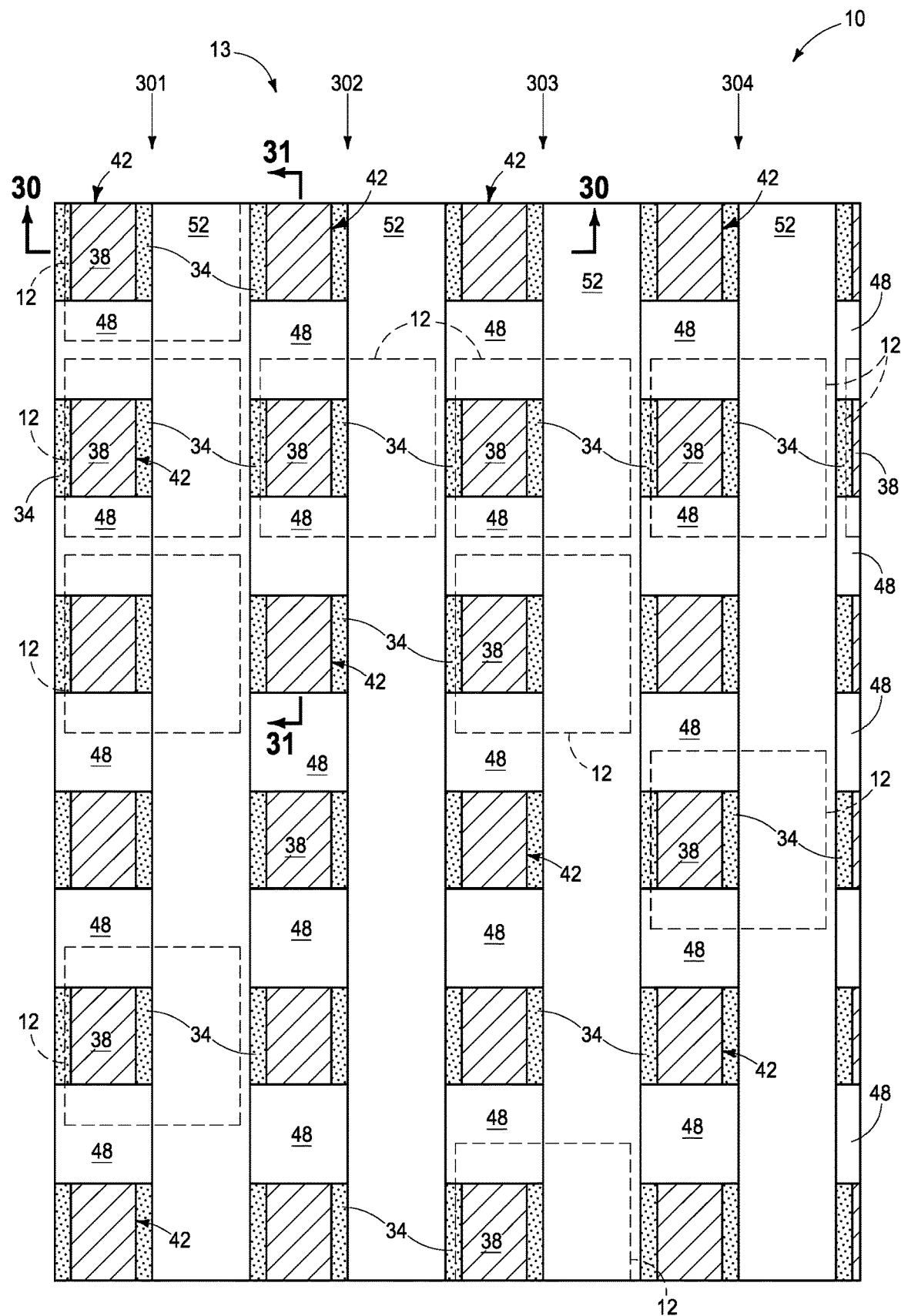
FIG. 29 is a view of the FIG. 27 construction at a processing step subsequent to that shown by FIG. 27.
Figure 30:
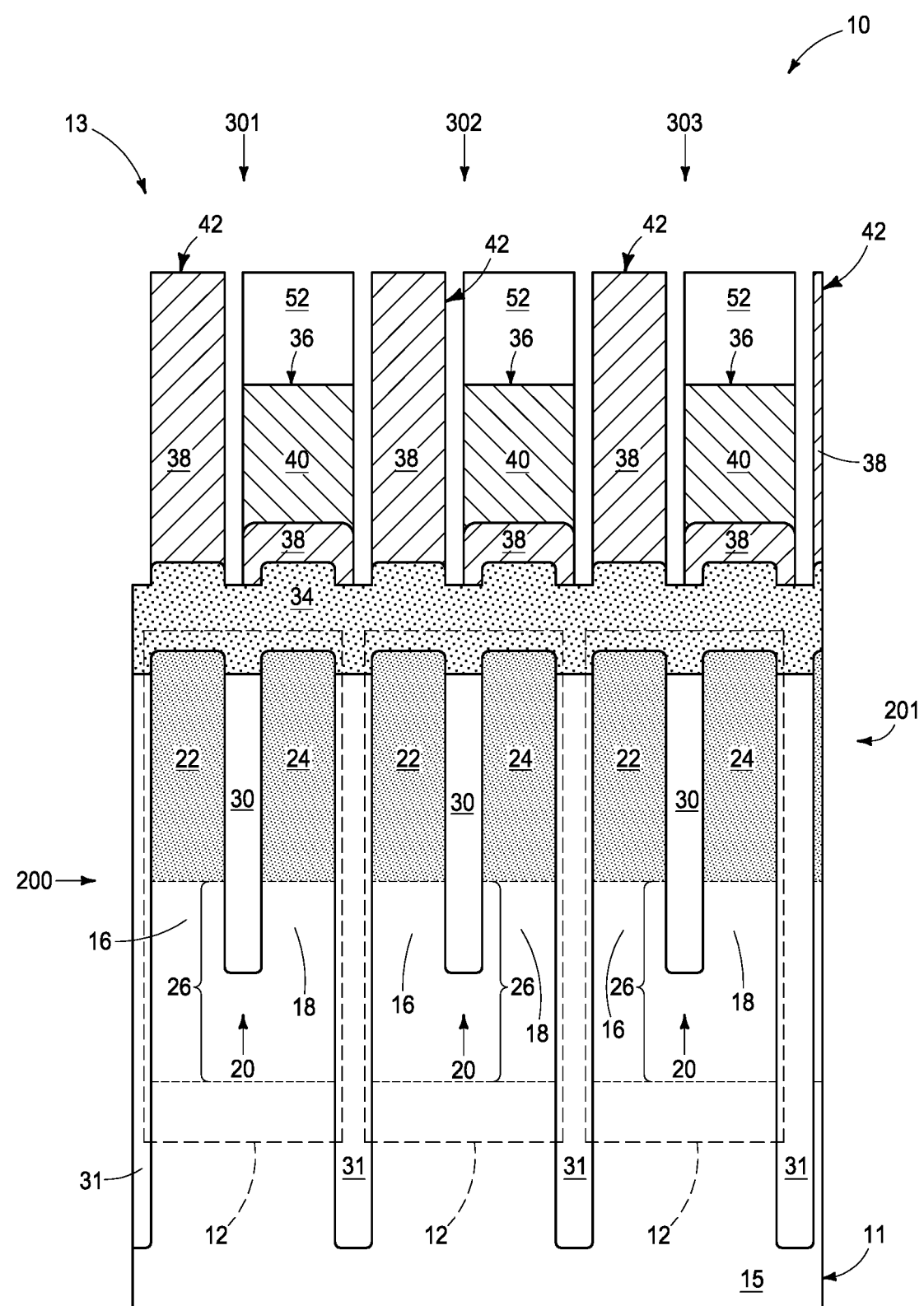
FIG. 30 is a cross-sectional view taken through line 30-30 in FIG. 29.
Figure 31:
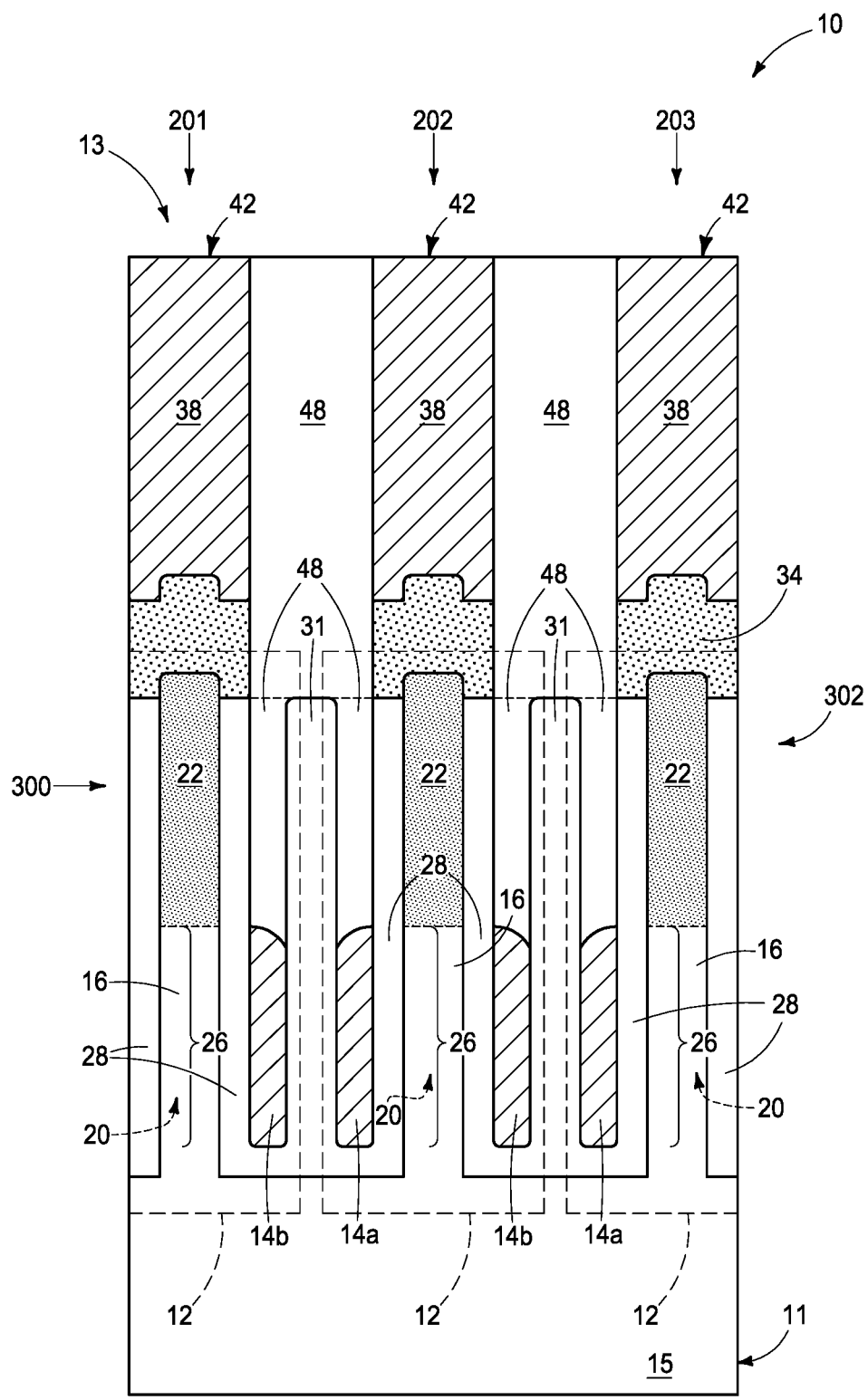
FIG. 31 is a cross-sectional view taken through line 31-31 in FIG. 29.

Referring to FIGS. 29-31, sacrificial material 56 (not shown) that was remaining laterally between remaining conductor material 38 and sense lines 36 has been removed (e.g., by selective etching).

Figure 32:
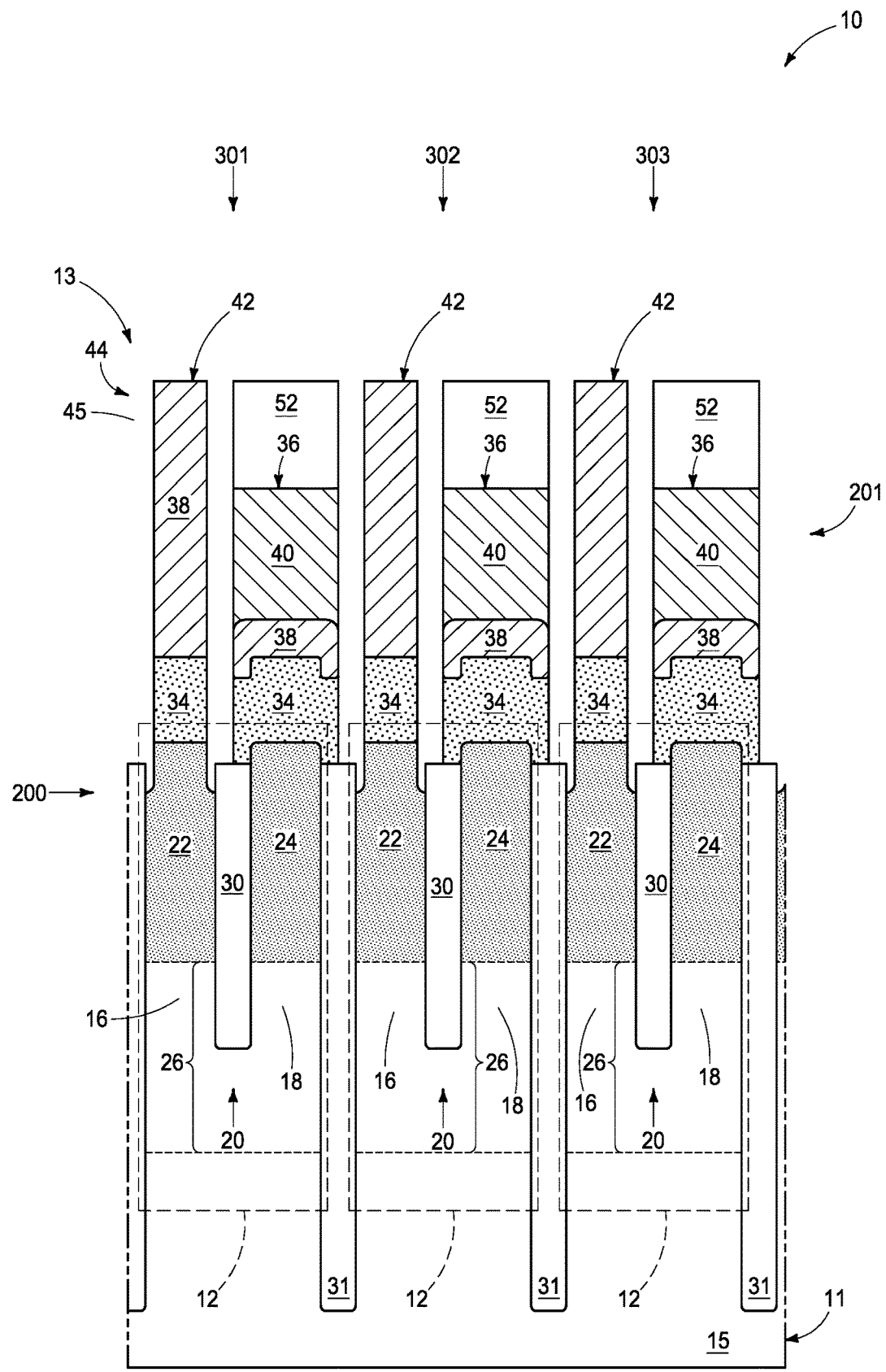
FIG. 32 is a view of the FIG. 30 construction at a processing step subsequent to that shown by FIG. 30.

Referring to FIG. 32, conductive material 34 has been patterned through (e.g., by selective etching) using sense lines 36, insulator material 48, and spaced elevationally-extending vias 42 as a second mask to stop conductive material 34 from intra-transistor-shorting and inter-transistor-shorting upper source/drain regions 22, 24 of first and second pedestals 16, 18, respectively, together. In one embodiment and as shown, the second mask comprises insulator material 52 atop sense lines 36 that remains as part of a finished construction of the array.

Figure 2:
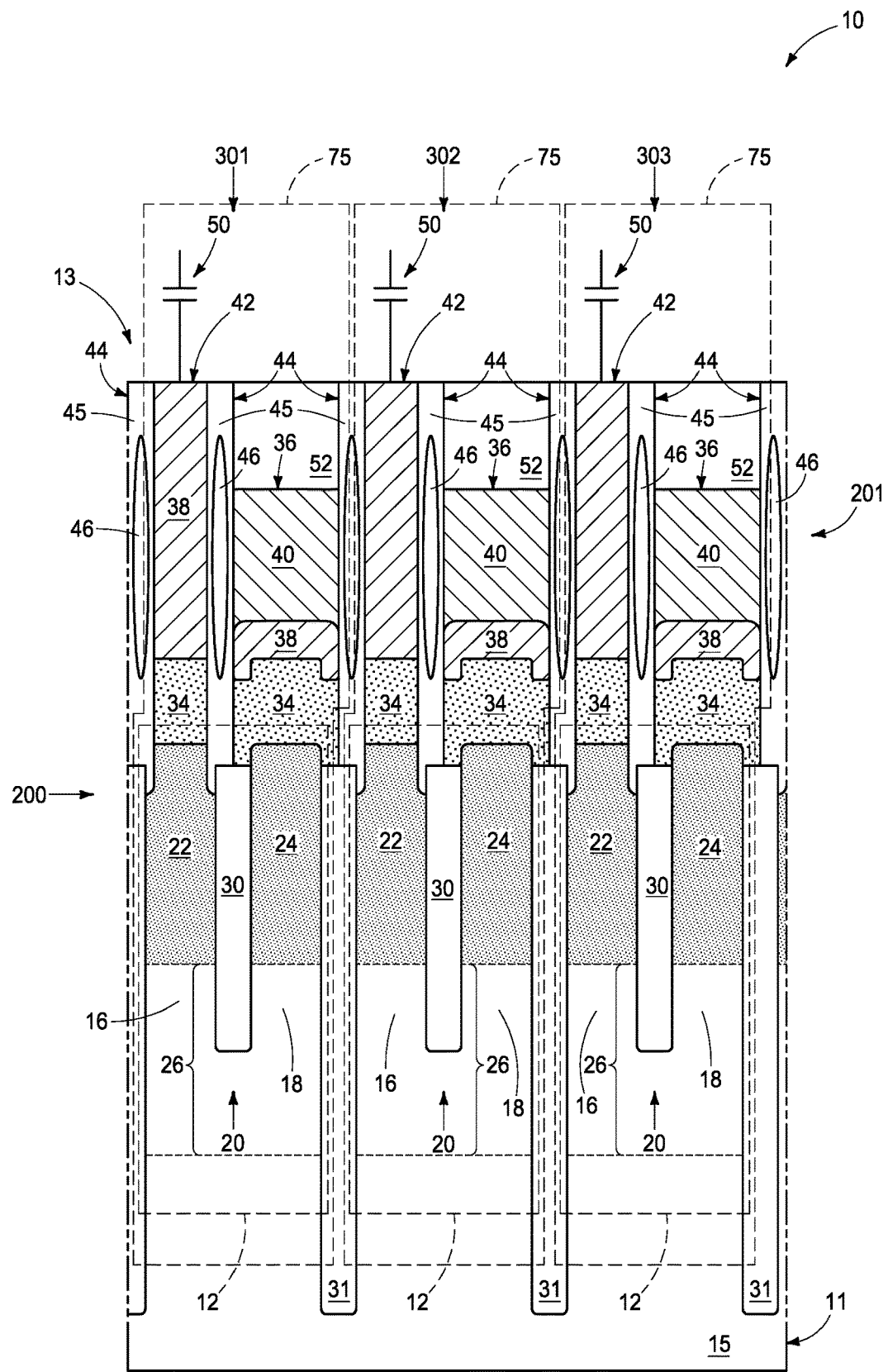
FIG. 2 is a cross-sectional view taken through line 2-2 in FIG. 1.
Figure 3:
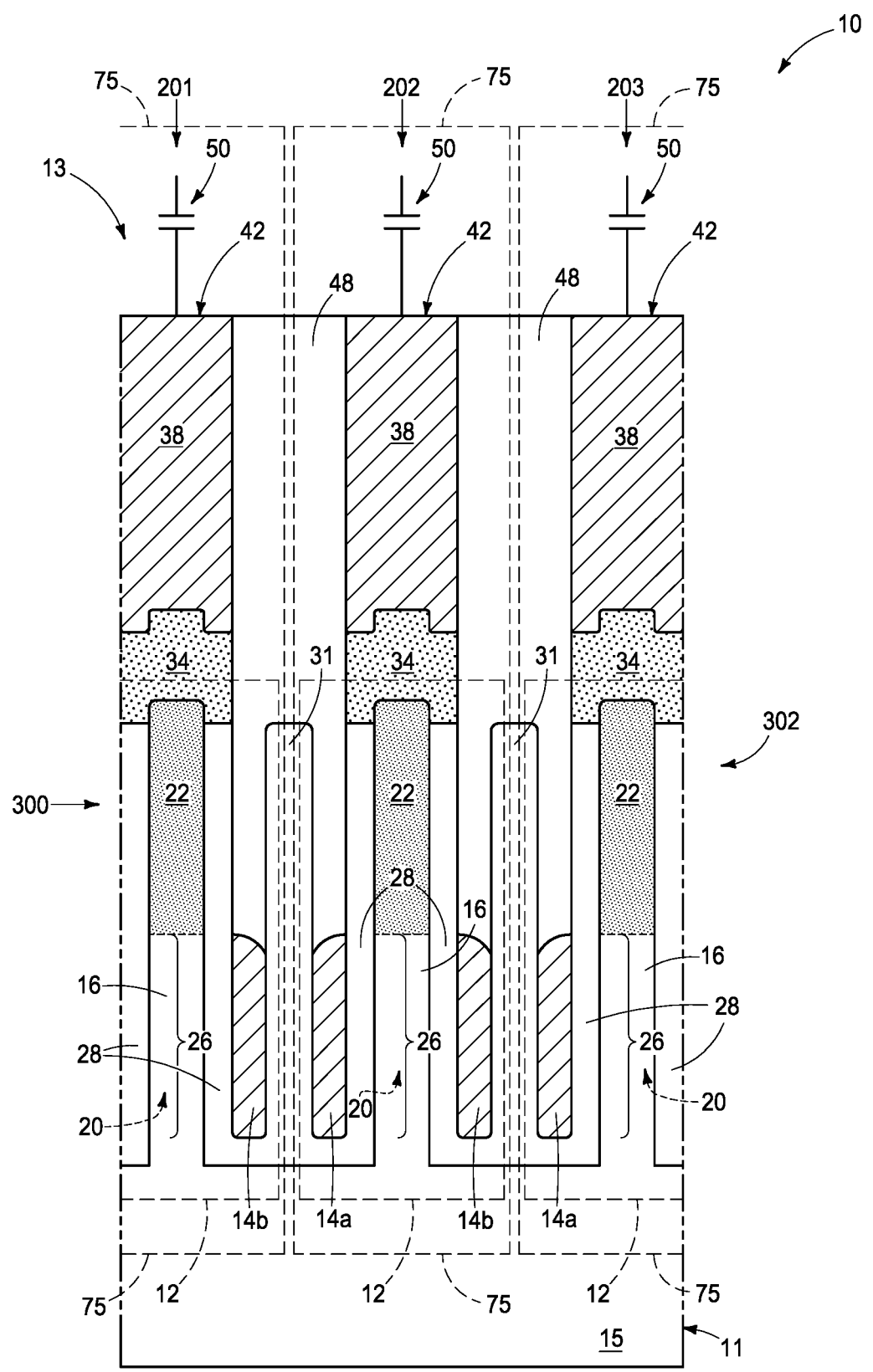
FIG. 3 is a cross-sectional view taken through line 3-3 in FIG. 1.
Figure 4:
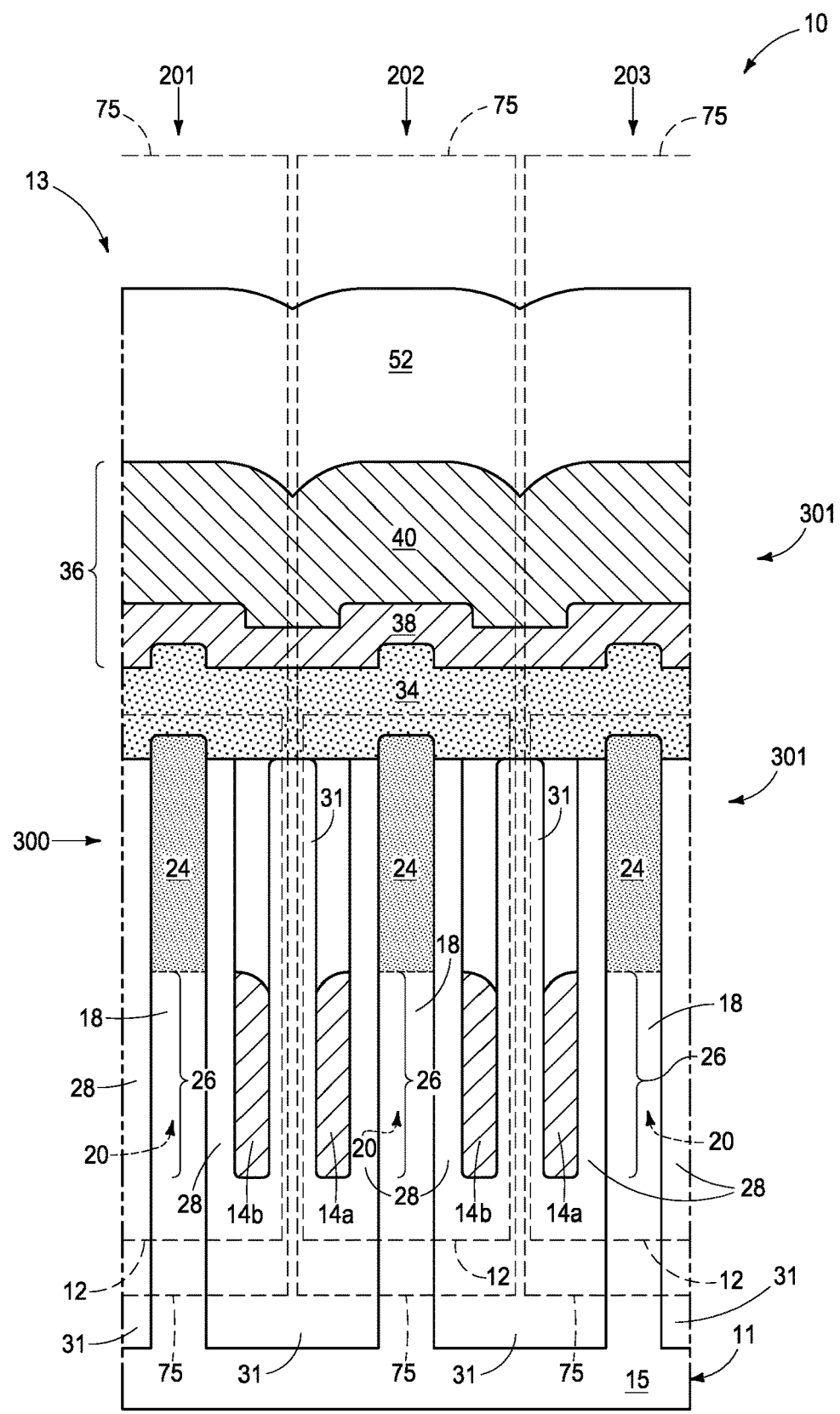
FIG. 4 is a cross-sectional view taken through line 4-4 in FIG. 1.

In one embodiment, sacrificial material 56 (not shown) is replaced with insulator material 44 (FIG. 2) that comprises an elevationally-elongated void space 46. In some embodiments, charge-storage devices 50 may be formed which are electrically coupled to, in one embodiment directly electrically coupled to, individual of elevationally-extending vias 42, for example as shown in FIG. 2.

An embodiment of the invention comprises a method used in forming an array (e.g., 13) of memory cells (e.g., 75). Such uses no more than two photolithographic masking steps in forming both: (a) sense lines (e.g., 36) longitudinally extending in a column direction (e.g., 300) that are individually directly above and electrically coupled to upper source/drain regions (e.g., 24) of multiple second pedestals (e.g., 18) in the column direction: and (b) spaced elevationally-extending vias (e.g., 42) laterally between immediately-adjacent of the sense lines directly above and electrically coupled to upper source/drain regions (e.g., 22) of multiple first pedestals (e.g., 16).

In one embodiment, such a method comprises using two and only two photolithographic masking steps in forming both of (a) and (b). In one embodiment, the forming of the spaced elevationally-extending vias comprises forming conductor-material lines (e.g., 58) in the column direction that are individually continuous in the column direction. One of the no more than two photolithographic masking steps is used to cut the conductor-material lines into the spaced elevationally-extending vias. In one such embodiment, the forming of the conductor-material lines comprises self-aligning the conductor material (e.g., 38) of the conductor-material lines in a row direction (e.g., 200) by and between immediately-adjacent of the sense lines. In one embodiment, conductive material (e.g., 34) is provided directly against the upper source/drain regions (e.g., 22, 24) prior to using such no more than two photolithographic masking steps.

Any other attribute(s) or aspect(s) as shown and/or described herein with respect to other embodiments may be used.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extending elevationally" refer to a direction that is angled away by at least 45° from exactly horizontal. Further, "extend(ing) elevationally" and "elevationally-extending" with respect to a field effect transistor are with reference to orientation of the transistor's channel length along which current flows in operation between the source/drain regions. For bipolar junction transistors, "extend(ing) elevationally" and "elevationally-extending" are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Use of "row" and "column" in this document is for convenience in distinguishing one series or orientation of features from another series or orientation of features and along which components have been or will be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles.

Also, "self-aligned" or "self-aligning" means a technique whereby at least one pair of opposing edges of a structure is formed by a pair of previously-defined edges, thereby not requiring subsequent photolithographic processing with respect to those opposing edges.

Reference to "first" and "second" with respect to different components or materials herein is only for convenience of description in referring to different components, different materials, and/or same materials or components formed at different times. Accordingly, and unless otherwise indicated, "first" and "second" may be interchanged independent of relative position within the finished circuit construction and independent of sequence in fabrication.

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Conductive components, features, regions, and materials herein may comprise, consist essentially of, or consist of one or more of conductively-doped semiconductive material(s) and/or metal material(s). A "metal material" is any one or combination of an elemental metal, a mixture or an alloy of two or more elemental metals, and any conductive metal compound.

In this document, a selective etch or removal is an etch or removal where one material is removed relative to another stated material at a rate of at least 2.0:1.

Conclusion

In some embodiments, a method used in forming an array of memory cells comprises providing a substrate comprising rows and columns of transistors. An access line interconnects multiple of the transistors along individual of the rows in a row direction. The transistors individually comprise first and second pedestals joined to one another through a valley region. The first and second pedestals individually comprise an upper source/drain region. The valley region comprises a channel region. A transistor gate is operatively laterally proximate at least one side of the channel region and comprises a portion of an individual of the access lines. No more than two photolithographic masking steps are used in forming both: (a) sense lines longitudinally extending in a column direction that are individually directly above and electrically coupled to the upper source/drain regions of multiple of the second pedestals in the column direction; and (b) spaced elevationally-extending vias laterally between immediately-adjacent of the sense lines directly above and electrically coupled to the upper source/drain regions of multiple of the first pedestals.

In some embodiments, a method used in forming an array of memory cells comprises providing a substrate comprising rows and columns of transistors. An access line interconnects multiple of the transistors along individual of the rows in a row direction. The transistors individually comprise first and second pedestals joined to one another through a valley region. The first and second pedestals individually comprise an upper source/drain region. The valley region comprises a channel region. A transistor gate is operatively laterally proximate at least one side of the channel region and comprises a portion of an individual of the access lines. The sense lines are used in forming conductor-material lines in the column direction that are self-aligned in the row direction by and between immediately-adjacent of the sense lines. The conductor-material lines are individually continuous in the column direction and are directly above and electrically coupled to the upper source/drain regions of multiple of the first pedestals. Sacrificial material is laterally between the conductor-material lines and the sense lines. Patterning is conducted through the conductor material of the conductor-material lines to form spaced elevationally-extending vias from the conductor-material lines that are directly above and electrically coupled to the upper source/drain regions of multiple of the first pedestals. The sacrificial material is laterally between remaining of the conductor material and the sense lines after patterning through the conductor material.

In some embodiments, a method used in forming an array of memory cells comprises providing a substrate comprising rows and columns of transistors. An access line interconnects multiple of the transistors along individual of the rows in a row direction. The transistors individually comprise first and second pedestals joined to one another through a valley region. The first and second pedestals individually comprise an upper source/drain region. The valley region comprises a channel region. A transistor gate is operatively laterally proximate at least one side of the channel region and comprises a portion of an individual of the access lines. Conductive material is formed above and electrically coupled to the upper source/drain regions of the first and second pedestals. The conductive material intra-transistor-shorts and inter-transistor-shorts the upper source/drain regions of the first and second pedestals together. Sense lines are formed that longitudinally extend in a column direction directly against the conductive material and are individually directly above the upper source/drain regions of multiple of the second pedestals. Spaced elevationally-extending vias are formed laterally between immediately-adjacent of the sense lines directly against the conductive material and directly above the upper source/drain regions of multiple of the first pedestals. Sacrificial material is laterally between the elevationally-extending vias and the sense lines. Patterning is conducted through the conductive material using the sense lines, the sacrificial material that is laterally between the spaced elevationally-extending vias and the sense lines, and the spaced elevationally-extending vias as a first mask. After the patterning using the first mask, insulator material is formed in spaces between the spaced elevationally-extending vias. After forming the insulator material, the sacrificial material that is laterally between the elevationally-extending vias and the sense lines is removed and replaced with dielectric material. Patterning is conducted through the conductive material using the sense lines, the insulator material, and the spaced elevationally-extending vias as a second mask to stop the conductive material from intra-transistor-shorting and inter-transistor-shorting the upper source/drain regions of the first and second pedestals together.

In some embodiments, a method used in forming an array of memory cells individually comprising a finFET transistor electrically coupled to a charge-storage device comprises providing a substrate comprising rows and columns of finFET transistors. An access line interconnects multiple of the finFET transistors along individual of the rows in a row direction. The finFET transistors individually comprise first and second pedestals joined to one another through a valley region. The first and second pedestals individually comprise an upper source/drain region. The valley region comprises a channel region. A transistor gate is operatively laterally proximate at least one side of the channel region and comprises a portion of an individual of the access lines. Conductive material is formed above and directly against the upper source/drain regions of the first and second pedestals. The conductive material intra-transistor-shorts and inter-transistor-shorts the upper source/drain regions of the first and second pedestals together. Sense lines are formed that longitudinally extend in a column direction directly against the conductive material and are individually directly above and directly electrically coupled to the upper source/drain regions of multiple of the second pedestals through the conductive material. The sense lines are used in forming conductor-material lines in the column direction that are self-aligned in the row direction by and between immediately-adjacent of the sense lines. The conductor-material lines are individually continuous in the column direction directly above and directly against the conductive material. The individual conductor-material lines are directly above and directly electrically coupled to the upper source/drain regions of multiple of the first pedestals through the conductive material. Sacrificial material is laterally between the conductor-material lines and the sense lines. Patterning is conducted through the conductor material of the conductor-material lines and through the sacrificial material to form spaced elevationally-extending vias from the conductor-material. The sacrificial material is laterally between remaining of the conductor material and the sense lines after patterning through the conductor material and through the sacrificial material. Patterning is conducted through the conductive material using the sense lines, the sacrificial material that is laterally between the remaining conductor material and the sense lines, and the spaced elevationally-extending vias as a first mask. After the patterning using the first mask, insulator material is formed in spaces between the spaced elevationally-extending vias. After forming the insulator material, the sacrificial material that is remaining laterally between the remaining conductor material and the sense lines is removed. After removing the sacrificial material, patterning is conducted through the conductive material using the sense lines, the insulator material, and the spaced elevationally-extending vias as a second mask to stop the conductive material from intra-transistor-shorting and inter-transistor-shorting the upper source/drain regions of the first and second pedestals together. A charge-storage device is formed that is electrically coupled to individual of the elevationally-extending vias.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming an array of memory cells, comprising:
   providing a substrate comprising rows and columns of transistors, an access line interconnecting multiple of the transistors along individual of the rows in a row direction, the transistors individually comprising first and second pedestals joined to one another through a valley region, each of the first pedestals comprising a first upper source/drain region and each of the second pedestals comprising a second upper source/drain region, the valley region comprising a channel region, a transistor gate operatively laterally proximate at least one side of the channel region and comprising a portion of an individual of the access lines;

forming a conductive material over the first and second upper source/drain regions;

forming sense lines longitudinally extending in a column direction that are individually directly above and electrically coupled to multiple of the second upper source/drain regions through the conductive material;

using the sense lines in forming conductor-material lines in the column direction that are self-aligned in the row direction by and between immediately-adjacent of the sense lines, the conductor-material lines comprising a conductor material, being individually continuous in the column direction and being directly above and electrically coupled to multiple of the first upper source/drain regions through the conductive material, sacrificial material being laterally between the conductor-material lines and the sense lines; and patterning through the conductor material of the conductor-material lines to form spaced elevationally-extending vias from the conductor-material lines that are directly above and electrically coupled to the upper source/drain regions of multiple of the first pedestals, the sacrificial material being laterally between remaining of the conductor material and the sense lines after patterning through the conductor material.

2. The method of claim 1 wherein patterning through the conductor material comprises using patterned masking material in a masking step, and further comprising also patterning through the sacrificial material using the patterned masking material in the masking step.

3. The method of claim 1 wherein the sacrificial material is dielectric.

4. The method of claim 1 comprising replacing the sacrificial material with dielectric material, the dielectric material comprising an elevationally-elongated void space.

5. The method of claim 1 wherein the patterning uses photoresist.

6. The method of claim 1 wherein the channel region comprises lowest portions of the first and second pedestals.

7. A method used in forming an array of memory cells, comprising:

providing a substrate comprising rows and columns of transistors, the transistors individually comprising first and second pedestals joined to one another through a valley region, each of the first pedestals comprising a first upper source/drain region and each of the second pedestals comprising a second upper source/drain region, the valley region comprising a channel region, a transistor gate operatively laterally proximate at least one side of the channel region;

forming sense lines longitudinally extending in a column direction that are individually directly above and electrically coupled to multiple of the second upper source/drain regions, the sense lines comprising a first metal material over a second metal material that differs from the first metal material;

using the sense lines in forming conductor-material lines in the column direction that are self-aligned in the row direction by and between immediately-adjacent of the sense lines, the conductor-material lines comprising a conductor material, being individually continuous in the column direction and being directly above and electrically coupled to multiple of the first upper source/drain regions, sacrificial material being laterally between the conductor-material lines and the sense lines; and patterning through the conductor material of the conductor-material lines to form spaced elevationally-extending vias from the conductor-material lines that are directly above and electrically coupled to the upper source/drain regions of multiple of the first pedestals, the elevationally-extending vias extending to elevationally above an uppermost surface of the sense lines, the sacrificial material being laterally between remaining of the conductor material and the sense lines after patterning through the conductor material.

8. The method of claim 7 further comprising forming an access line interconnecting multiple of the transistors along individual of the rows in a row direction.

9. The method of claim 8 wherein the transistor gate comprises a portion of the access line.

10. The method of claim 7 further comprising replacing the sacrificial material with dielectric material.

11. The method of claim 10 wherein the dielectric material comprises an elevationally-elongated void space.

12. The method of claim 7 wherein the conductor-material lines comprise conductively-doped semiconductor material.

13. The method of claim 7 wherein the channel region extends partially up the first and second pedestals.

* * * * *